(12) United States Patent
Kim et al.

(10) Patent No.: US 12,236,847 B2
(45) Date of Patent: Feb. 25, 2025

(54) DISPLAY APPARATUS AND MULTI-SCREEN DISPLAY APPARATUS INCLUDING THE SAME

(71) Applicant: LG Display Co., Ltd., Seoul (KR)

(72) Inventors: Subin Kim, Gyeonggi-do (KR); YoungIn Jang, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/223,868

(22) Filed: Jul. 19, 2023

(65) Prior Publication Data
US 2024/0029634 A1    Jan. 25, 2024

(30) Foreign Application Priority Data
Jul. 22, 2022 (KR) .......... 10-2022-0090959

(51) Int. Cl.
*G09G 3/32* (2016.01)
*G09G 3/3233* (2016.01)
*G09G 3/3266* (2016.01)

(52) U.S. Cl.
CPC ............. *G09G 3/32* (2013.01); *G09G 3/3233* (2013.01); *G09G 3/3266* (2013.01); *G09G 2300/026* (2013.01); *G09G 2300/0408* (2013.01); *G09G 2300/0413* (2013.01); *G09G 2300/0426* (2013.01); *G09G 2310/0267* (2013.01)

(58) Field of Classification Search
None
See application file for complete search history.

(56) References Cited

U.S. PATENT DOCUMENTS

| | | | |
|---|---|---|---|
| 10,403,207 B2 * | 9/2019 | Kang | G09G 3/3258 |
| 2010/0038641 A1 * | 2/2010 | Imai | H01L 29/7869 |
| | | | 257/E29.29 |
| 2013/0321499 A1 * | 12/2013 | Park | G09G 3/3275 |
| | | | 345/698 |
| 2017/0287988 A1 * | 10/2017 | Lee | H10K 50/19 |
| 2019/0164478 A1 * | 5/2019 | Kim | H10K 59/131 |
| 2021/0201818 A1 * | 7/2021 | Jang | H01L 27/124 |
| 2021/0202676 A1 * | 7/2021 | Jeong | G09G 3/3266 |

* cited by examiner

*Primary Examiner* — Dorothy Harris
(74) *Attorney, Agent, or Firm* — Morgan, Lewis & Bockius LLP

(57) ABSTRACT

The present disclosure relates to a display apparatus and a multi-screen display apparatus including the same. The display apparatus includes a substrate including a display area including a plurality of pixels disposed along a first direction and a second direction intersecting with the first direction, and a gate driving circuit including a plurality of stage circuit units respectively disposed at a plurality of horizontal lines of the display area to supply a scan signal to the plurality of pixels. Each of the plurality of stage circuit units includes a plurality of branch circuits supplying the scan signal to the plurality of pixels, and a plurality of circuit connection lines connected to the plurality of branch circuits and formed of a transparent conductive material.

27 Claims, 17 Drawing Sheets

DISPLAY APPARATUS AND MULTI-SCREEN DISPLAY APPARATUS INCLUDING THE SAME

CROSS-REFERENCE TO RELATED APPLICATIONS

This application claims the benefit and priority to of the Korean Patent Application No. 10-2022-0090959 filed in the Republic of Korea on Jul. 22, 2022, the entirety of which is hereby incorporated by reference for all purposes, as if fully set forth herein.

BACKGROUND

Technical Field

The present disclosure relates to an apparatus, and particularly to, for example, without limitation, a display apparatus and a multi-screen display apparatus including the same.

Discussion of the Related Art

Display apparatuses are equipped in home appliances or electronic devices such as televisions (TVs), monitors, notebook computers, smartphones, tablet personal computers (PCs), electronic pads, wearable devices, watch phones, portable information devices, navigation devices, and vehicle control display apparatus, or the like, and are used as a screen for displaying an image.

Display apparatuses include a display panel which includes a plurality of pixels each including a thin film transistor (TFT) connected to a data line and a gate line, a data driving circuit which supplies a data voltage to the data line, and a gate driving circuit which supplies a gate signal to the gate line.

Recently, a display apparatus having a gate-in panel (GIP) structure are being used where a gate driving circuit is embedded into a non-display area of a display panel simultaneously with a process of manufacturing a TFT of each pixel, for simplifying a configuration of a circuit element, decreasing the manufacturing cost, and reducing a bezel width.

A display panel including a gate driving circuit having a GIP structure includes a bezel area due to a gate driving circuit disposed in the non-display region. Thus, a display apparatus of the related art needs a bezel or a mechanism for covering a bezel area of a display panel, and due to a width of the bezel area, a bezel width may increase.

Recently, research for transparent display apparatuses enabling a user (or a viewer) to see a thing or a background located at a rear surface of a display apparatus are being actively done.

Transparent display apparatuses may be categorized into transmissive parts which transmit all or most of lights incident thereon and emission parts which emit lights. A user may see a thing or a background, located at a rear surface of a transparent display apparatus, through the transmissive parts.

SUMMARY

Accordingly, embodiments of the present disclosure are directed to a display apparatus and a multi-screen display apparatus including the same that substantially obviate one or more problems due to limitations and disadvantages of the related art.

An aspect of the present disclosure is to provide a display apparatus or a transparent display apparatus, in which a size (or transmittance or transparency) deviation between transmissive parts may be reduced, minimized or prevented.

An aspect of the present disclosure is to provide a display apparatus (or a transparent display apparatus) and a multi-screen display apparatus including the same, which may reduce, minimize or prevent an image quality defect such as line-shaped stripes caused by a size (or transmittance or transparency) deviation between transmissive parts.

An aspect of the present disclosure is to provide a display apparatus (or a transparent display apparatus) and a multi-screen display apparatus including the same, which has a zero-bezel or nearly zero-bezel width.

Additional features and aspects will be set forth in part in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display apparatus may comprise a substrate including a display area including a plurality of pixels disposed along a first direction and a second direction intersecting with the first direction, and a gate driving circuit including a plurality of stage circuit units respectively disposed at a plurality of horizontal lines of the display area to supply a scan signal to the plurality of pixels, each of the plurality of stage circuit units comprises a plurality of branch circuits supplying the scan signal to the plurality of pixels, and a plurality of circuit connection lines connected to the plurality of branch circuits and formed of a transparent conductive material.

In another aspect, a multi-screen display apparatus may comprise a plurality of display apparatuses arranged in at least one direction of a first direction and a second direction intersecting with the first direction, each of the plurality of display apparatuses may comprise a substrate including a display area including a plurality of pixels disposed along a first direction and a second direction intersecting with the first direction, and a gate driving circuit including a plurality of stage circuit units respectively disposed at a plurality of horizontal lines of the display area to supply a scan signal to the plurality of pixels, each of the plurality of stage circuit units comprises a plurality of branch circuits supplying the scan signal to the plurality of pixels, and a plurality of circuit connection lines connected to the plurality of branch circuits and formed of a transparent conductive material.

In a further aspect, a display apparatus may comprise: a display panel, including: a substrate including a display area including a plurality of pixels disposed along a first direction and a second direction intersecting with the first direction; and a gate driving circuit including a plurality of stage circuit units respectively disposed at a plurality of horizontal lines of the display area to supply a scan signal to the plurality of pixels in response to a gate control signal, wherein each of the plurality of stage circuit units comprises: a plurality of branch circuits supplying the scan signal to the plurality of pixels; and a plurality of circuit connection lines connected to the plurality of branch circuits, the plurality of circuit connection lines including a transparent conductive material; and a driving circuit unit supplying the gate control signal to the gate driving circuit.

Specific details according to various examples of the present disclosure other than the means for solving the above-mentioned problems are included in the description and drawings below.

Some embodiments of the present disclosure may provide a display apparatus for reducing, minimizing or preventing a size (or transmittance or transparency) deviation between transmissive parts.

Some embodiments of the present disclosure may provide a display apparatus and a multi-screen display apparatus, in which a total light transmission rate (or transmittance) of a display area may be enhanced or increased by light passing through circuit connection lines (or horizontal lines) which include a transparent conductive material and are connected to branch circuits of a gate driving circuit between a plurality of pixels.

Some embodiments of the present disclosure may provide a display apparatus and a multi-screen display apparatus including the same, which may reduce, minimize or prevent an image quality defect such as line-shaped stripes caused by a size deviation between branch circuits of a gate driving circuit between a plurality of pixels.

Some embodiments of the present disclosure may provide a display apparatus and a multi-screen display apparatus including the same, which may reduce, minimize or prevent an image quality defect such as line-shaped stripes caused by a size (or transmittance or transparency) deviation between transmissive parts disposed between a plurality of pixels.

Some embodiments of the present disclosure may provide a display apparatus and a multi-screen display apparatus including the same, which has a zero-bezel width.

Some embodiments of the present disclosure may provide a display apparatus and a multi-screen display apparatus including the same, which display an image without a sense of discontinuity, in displaying one image on a whole screen.

Some embodiments of the present disclosure may provide a transparent display apparatus and a transparent multi-screen display apparatus including the same, which has an enhanced transparency or transmittance.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description are exemplary and explanatory, and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION

Figure 1:
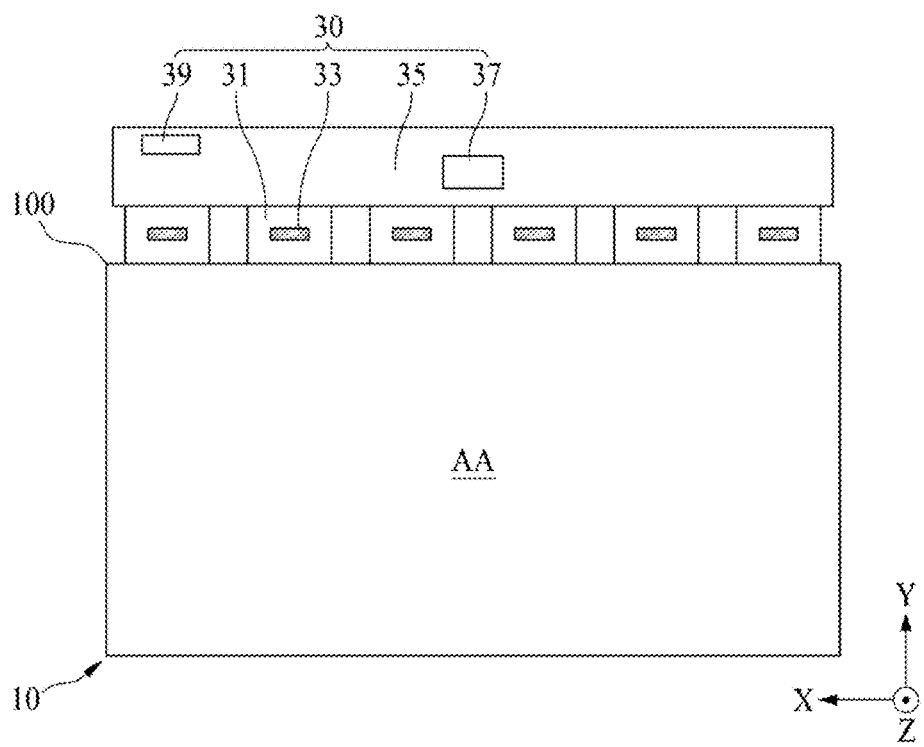
FIG. 1 is a diagram illustrating a display apparatus according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Same reference numerals designate same elements throughout. Names of the respective elements used in the following explanations are selected only for convenience of writing the disclosure and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present disclosure are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used. In the description of embodiments, when a structure is described as being positioned "on or above or over" or "under or below" another structure, this description should be construed as including a case in which the structures contact each other as well as a case in which a third structure is disposed therebetween.

In describing a time relationship, for example, when the temporal order is described as, for example, "after," "subsequent," "next," and "before,", or the like a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Hereinafter, embodiments of the present disclosure will be described in detail with reference to the accompanying drawings. For convenience of description, a scale of each of elements illustrated in the accompanying drawings differs from a real scale, and thus, is not limited to a scale illustrated in the drawings.

The display apparatus according to an embodiment of the present disclosure may be a flexible display apparatus, a display panel, or a flexible display panel, but embodiments of the present disclosure are not limited thereto. For example, the display apparatus according to an embodiment of the present disclosure may include a set electronic apparatus or a set device (or a set apparatus) such as a notebook computer, a television, a computer monitor, an equipment apparatus including an automotive apparatus or another type apparatus for vehicles, or a mobile electronic apparatus such as a smartphone or an electronic pad, which is a complete product (or a final product) including a liquid crystal display panel or an organic light emitting display panel, or the like.

Figure 2:
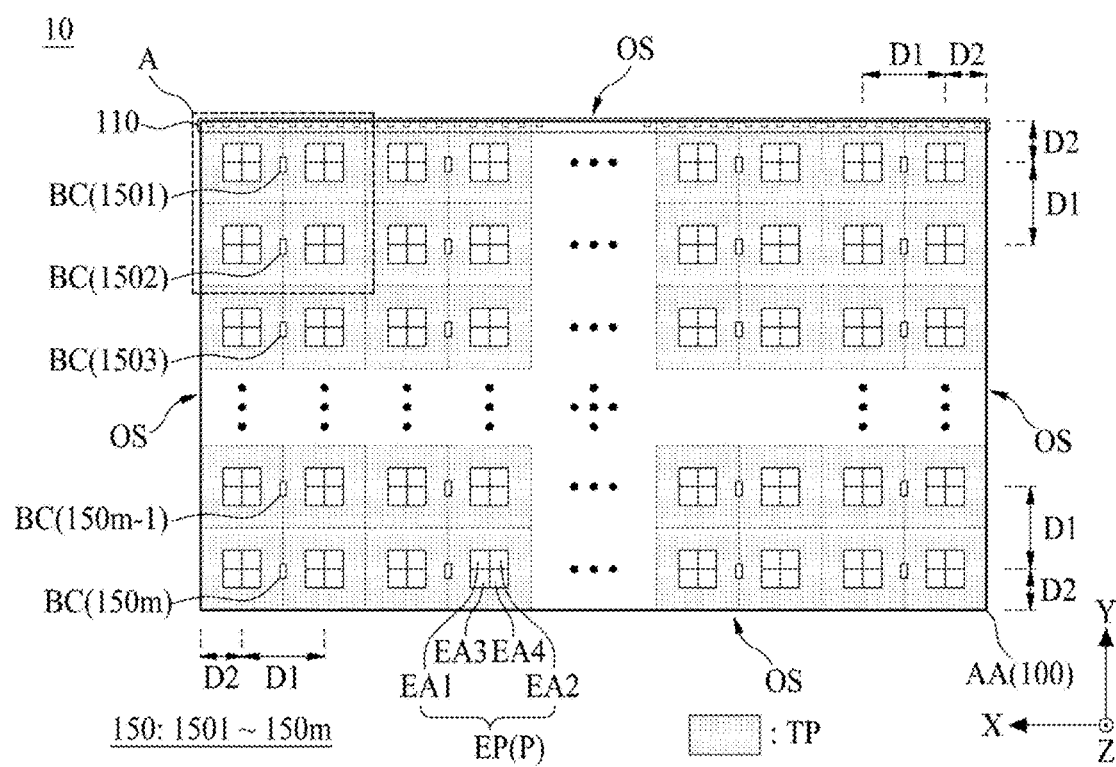
FIG. 2 is a diagram illustrating a display panel illustrated in FIG. 1.

FIG. 1 is a diagram illustrating a display apparatus according to an embodiment of the present disclosure. FIG. 2 is a diagram illustrating a display panel illustrated in FIG. 1. All the components or elements of each display apparatus according to all embodiments of the present disclosure are operatively coupled and configured.

Referring to FIGS. 1 and 2, the display apparatus according to an embodiment of the present disclosure may include a display panel 10 and a driving circuit unit 30.

The display panel 10 may include a substrate 100 including a display area AA, a plurality of pixels P arranged at a first interval D1 on the display area AA of the substrate 100, and a gate driving circuit 150 disposed in (or within) the display area AA. The substrate 100 may include glass, plastic, or a flexible polymer film. For example, the flexible polymer film may be made of any one of polyimide (PI), polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), polysulfone (PSF), or ciclic-olefin copolymer, cyclic olefin copolymer (COC), triacetylcellulose (TAC) film, polyvinyl alcohol (PVA) film, and polystyrene (PS), and the present disclosure is not limited thereto.

The display area AA may be an area which displays an image and may be referred to as an active area or a display portion. A size of the display area AA may be the same as or substantially the same as the substrate 100 (or the display apparatus). For example, a size of the display area AA may be the same as a whole size of the first surface of the substrate 100. Therefore, the substrate 100 may not include an opaque non-display area which is provided along a periphery portion of the first surface to surround all of the display area AA. Accordingly, a whole front surface of the display apparatus may be configured as the display area AA.

An end (or an outermost portion) of the display area AA may overlap or may be substantially aligned with the outer surface OS of the substrate 100. Therefore, lateral surfaces of the display area AA may not be surrounded by a separate mechanism and may be surrounded by only air. That is, all lateral surfaces of the display area AA may be provided in a structure which directly contacts air without being surrounded by a separate mechanism.

The display area AA according to an embodiment may include a plurality of pixels P. The plurality of pixels P according to an embodiment may be arranged (or disposed) to have the first interval D1 in the display area AA of the substrate 100. Each of the plurality of pixels P may directly contact to one another along each of a first direction X and a second direction Y transverse (or crossing) to the first direction X without a separation space. The first direction X may be a first lengthwise direction (for example, a widthwise direction) of the substrate 100 or the display apparatus, and the second direction Y may be a second lengthwise direction (for example, a lengthwise direction) of the substrate 100 or the display apparatus.

The first interval D1 may be a pitch (or a pixel pitch) between two adjacent pixels P. For example, the first interval D1 may be a distance (or a shortest distance or a shortest length) between center portions of two adjacent pixels P. Each of the plurality of pixels P may have a first length parallel to the first direction X and a second length parallel to the second direction Y. Each of the plurality of pixels P may have a square shape including the first length and the second length, but embodiments of the present disclosure are not limited thereto.

A center portion of each of the outermost pixels disposed along a periphery portion (or an edge portion) of the substrate 100 among the plurality of pixels P may be spaced apart from the outer surface OS of the substrate 100 to have a second interval D2. The second interval D2 may be half or less of the first interval D1 so that the whole front surface of the substrate 100 (or the whole front surface of the display apparatus) is configured as the display area AA. For example, the second interval D2 may be a shortest distance (or a shortest length) between the center portion of the outermost pixel Po and the outer surface OS of the substrate 100.

When the second interval D2 is greater than half of the first interval D1, the substrate 100 may include a non-display area surrounding all of the display area AA by an area between an end of the outermost pixel Po (or the end of the display area AA) and the outer surface OS of the substrate 100, and thus, the substrate 100 may necessarily include a bezel area based on the non-display area surrounding all of the display area AA. On the other hand, when the second interval D2 is half or less of the first interval D1, the end of the outermost pixel Po (or the end of the display area AA) may overlap (or align) the outer surface OS of the substrate 100 or may be disposed in a space outside the outer surface OS of the substrate 100, and thus, the display area AA may be configured (or disposed) on the whole front surface of the substrate 100 or may have the same size (or area) as the substrate 100.

Each of the plurality of pixels P may include an emission part (or a light emitting part) EP. The emission part EP according to an embodiment of the present disclosure may include first to fourth emission areas EA1 to EA4. For example, the first to fourth emission areas EA1 to EA4 may directly contact to one another in the first direction X and the second direction Y without a separation space. However, the number of the emission areas included in the emission part EP of the pixel P is not limited to four, and may be one, two, three, five or more in other examples.

The first to fourth emission areas EA1 to EA4 according to an embodiment of the present disclosure may be disposed in a 2×2 form or a quad structure. For example, each of the emission areas EA1 to EA4 may have a uniform quad structure having the same size (or same area) or a non-uniform quad structure having different sizes (or different area). For example, the emission areas EA1 to EA4 having the uniform quad structure or the non-uniform quad structure may be disposed to be concentrated at the center portion CP of the pixel P, but embodiments of the present disclosure are not limited thereto.

Each of the first to fourth emission areas EA1 to EA4 according to another embodiment of the present disclosure may have a rectangular shape which includes a short side parallel to the first direction X and a long side parallel to the second direction Y, and for example, may be disposed in a 1×4 form or a 1×4 stripe form. The shapes of the emission areas are not limited to the square or rectangular shape, and other shapes such as a circular shape, an ellipse or oval shape, a quadrilateral shape, a pentagon shape, or a hexagon shape may also be possible.

According to an embodiment of the present disclosure, the first emission area EA1 may be configured to emit light of a first color, the second emission area EA2 may be configured to emit light of a second color, the third emission area EA3 may be configured to emit light of a third color, and the fourth emission area EA4 may be configured to emit light of a fourth color. As an embodiment, each of the first to fourth colors may be different. For example, the first color may be red, the second color may be blue, the third color may be white, and the fourth color may be green. As another embodiment, some of the first to fourth colors may be the same. For example, the first color may be red, the second color may be first green, the third color may be second green, and the fourth color may be blue. In another example, the first color may be cyan, the second color may be magenta, the third color may be yellow, and the fourth color may be any one of cyan, magenta, or yellow, but the present disclosure is not limited thereto.

The emission part EP according to another embodiment may include first to third emission areas EA1 to EA3. In this case, the first to third emission areas EA1 to EA3 may each have a rectangular shape which includes a short side parallel to the first direction X and a long side parallel to the second direction Y, and for example, may be disposed in a 1×3 form or a 1×3 stripe form. For example, the first emission area EA1 may be configured to emit light of a first color, the second emission area EA2 may be configured to emit light of a second color, and the third emission area EA3 may be configured to emit light of a third color. For example, the first color may be red, the second color may be blue, and the third color may be green.

The gate driving circuit 150 is disposed or mounted in (or within) the display area AA to supply a scan signal (or a gate signal) to the pixels P disposed on the substrate 100. The gate driving circuit 150 may simultaneously supply the scan signal to pixels P disposed in a horizontal line parallel to the first direction X. For example, the gate driving circuit 150 may supply at least one scan signal to pixels P disposed in one horizontal line. For example, the gate driving circuit 150 may include a plurality of branch circuits BC which are disposed one by one between one or more pixels P to supply the scan signal to the plurality of pixels P. For example, the gate driving circuit 150 may be a built-in gate driving circuit, a scan driving circuit, a column driving circuit, or a horizontal driving circuit.

The gate driving circuit 150 according to an embodiment of the present disclosure may be configured with a shift register including a plurality of stage circuit units 1501 to 150*m*. For example, the display apparatus according to an embodiment of the present disclosure may include a shift register which is disposed in (or within) the display area AA of the substrate 100 to supply the scan signal to the pixel P.

Each of the plurality of stage circuit units 1501 to 150*m* may include a plurality of branch circuits BC which are disposed in each horizontal line of the substrate 100 along the first direction X. The plurality of branch circuits BC may include one or more TFT (or a branch TFT) and may be disposed to be dispersed (or distributed) in (or within) one horizontal line along the first direction X. For example, each of the plurality of branch circuits BC may be disposed one by one between one or more pixels P, but embodiments of the present disclosure are not limited thereto.

According to an embodiment of the present disclosure, at least some of the plurality of branch circuits BC may have different sizes (or areas). For example, at least some of the plurality of branch circuits BC may be configured by one thin film transistor, and the rest of the plurality of branch circuits BC may be configured by two or more thin film transistors.

Each of the plurality of stage circuit units 1501 to 150*m* may generate a scan signal according to driving of the plurality of branch circuits BC which responds to a gate control signal supplied from the driving circuit unit 30 through a plurality of gate control lines disposed between the plurality of pixels P in (or within) the display area AA, and may supply the scan signal to pixels disposed in a corresponding horizontal line.

Each of the plurality of stage circuit units 1501 to 150*m* may include, but not limited to, a node control circuit, an inverter circuit, a node reset circuit, and a plurality of output buffer circuits. Each of the node control circuit, the inverter circuit, the node reset circuit, and the plurality of output buffer circuits may be configured to include one or more branch circuit of the plurality of branch circuits BC. For example, the node control circuit, the inverter circuit, and the node reset circuit may configure as one stage or one shift register. Accordingly, each of the plurality of stage circuit units 1501 to 150*m* configured by the plurality of branch circuits BC may include one or more stages and a plurality of output buffer circuits (or buffers). For example, each of the plurality of stage circuit units 1501 to 150*m* may include one or more first output buffer circuit configured to supply a scan signal to odd-numbered gate lines disposed in (or within) the corresponding horizontal lines, one or more second output buffer circuit configured to supply a scan signal to even-numbered gate lines disposed in (or within) the corresponding horizontal lines, and a carry output buffer circuit configured to output a carry signal.

The display panel 10 according to an embodiment of the present disclosure may further include a pad part 110 having a plurality of pads which are disposed in the display area AA of the substrate 100 and are connected to each of the plurality of pixels P and the gate driving circuit 150. For example, the pad part 110 may be a first pad part or a front pad part. The pad part 110 may receive a data signal, a gate control signal, a pixel driving power, and a pixel common voltage, or the like from the driving circuit unit 30.

Figure 3:
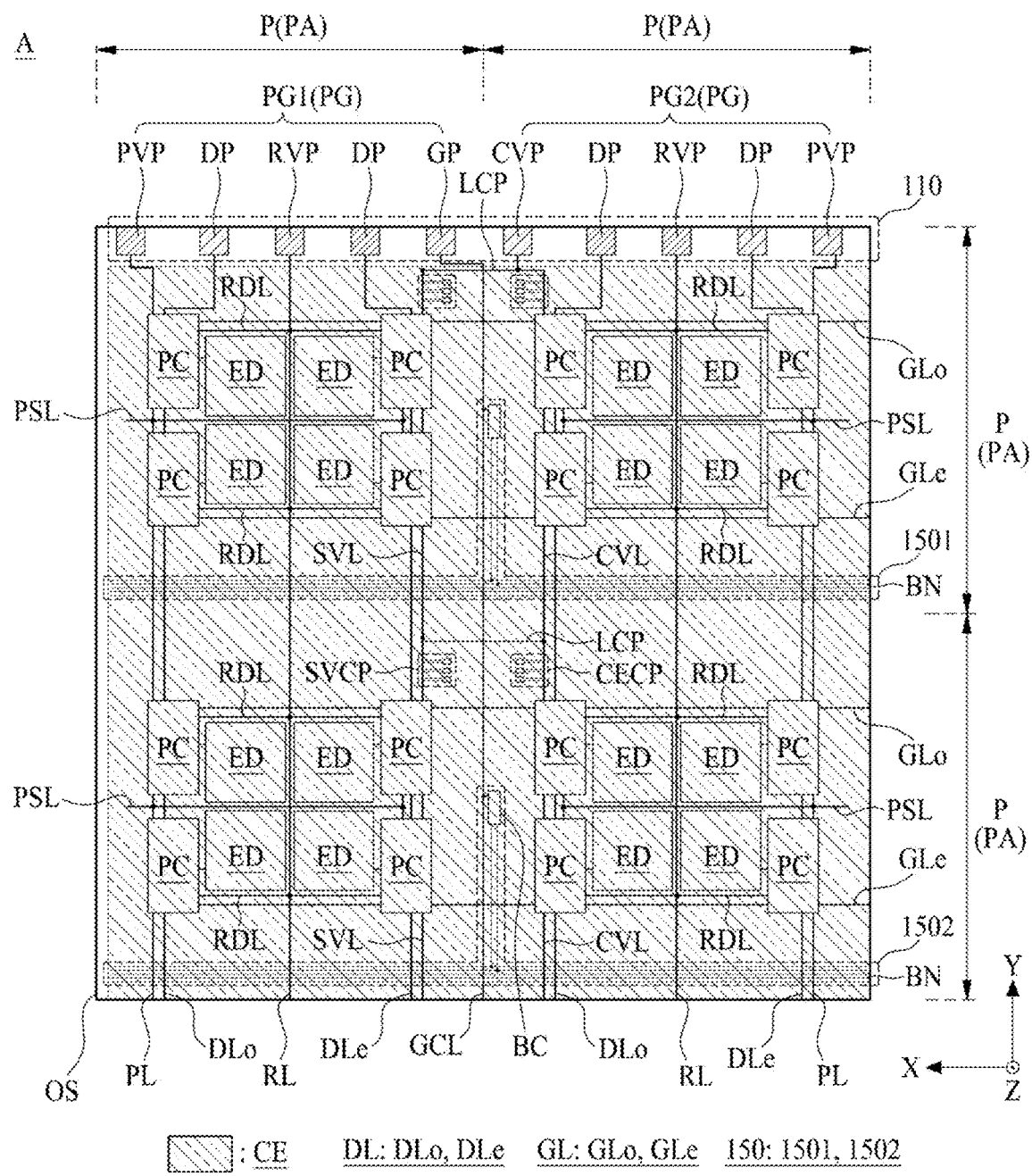
FIG. 3 is an enlarged view of a region 'A' illustrated in FIG. 2.

The pad part 110 may be included in the outmost pixels Po disposed at a first periphery portion of the first surface of the substrate 100 parallel to the first direction X. That is, the outermost pixels Po disposed at the first periphery portion of the substrate 100 may include at least one of the plurality of pads. Therefore, the plurality of pads may be disposed or included in (or within) the display area AA, and thus, a non-display area (or a bezel area) based on the pad part 110 may not be formed or may not be on the substrate 100. For example, the pad part 110 according to an embodiment of the present disclosure is disposed between the outer surface OS of the substrate 100 and the emission area of the outermost pixels and is included in (or within) the outermost pixels, and thus, a non-display area (or bezel area) based on the pad part 110 may not be formed or may not be in a region between the outer surface OS of the substrate 100 and the outermost pixels. Therefore, the outermost pixels may include the pad part 110, and thus, may be configured to have a configuration or a structure, which differs from the internal pixel including no pad part 110. Although it is shown in FIGS. 2 and 3 that the pad part 110 is disposed around an upper edge of the substrate 100, the location and number of the pad part 110 are not limited thereto. For example, the pad part 110 may be disposed around at least one of the upper edge, lower edge, left edge and right edge of the substrate 100.

The display apparatus (or the display panel 10 or the display area AA) according to an embodiment of the present disclosure may further include a transmissive part (a light transmitting part) TP, and thus, may configure a transparent display apparatus with the transmissive part TP.

The transmissive part TP may be a region which transmits all or most of light incident on the display panel 10 or the display area AA. The transmissive part TP may be configured to transmit all or most of light incident thereon so that a user (or a viewer) sees a thing or a background located at a rear surface of the display panel 10 or the display area AA.

The transmissive part TP according to an embodiment of the present disclosure may be disposed at a periphery of the emission part EP of each of the plurality of pixels P, or may be a peripheral region of the emission part EP of each of the plurality of pixels P. For example, each of the plurality of pixels P may include the emission part EP and the transmissive part TP at a periphery of the emission part EP. For example, the transmissive part TP may be disposed between the emission part EP of each of the plurality of pixels P which is disposed along each of the first direction X and the second direction Y. For example, the transmissive part TP may be disposed between the emission part EP of two adjacent pixels P along each of the first direction X and the second direction Y. For example, the transmissive part TP may be the other region, except the emission part EP of each of the plurality of pixels P, of a region of the display area AA. For example, branch circuit BC of the gate driving circuit 150 and the pad part 110 may be disposed in the transmissive part TP. For example, each of the plurality of branch circuit BC may be disposed in (or at) the transmissive part TP between the plurality of pixels P.

The driving circuit unit 30 may be connected to the pad part 110 and may allow each pixel P to display an image corresponding to image data supplied from a display driving system.

The driving circuit unit 30 according to an embodiment of the present disclosure may include a plurality of flexible circuit films 31, a plurality of driving integrated circuits (ICs) 33, a printed circuit board (PCB) 35, a timing controller 37, and a power circuit part 39.

Each of the plurality of flexible circuit films 31 may be attached on the PCB 35 and the pad part 110. The flexible circuit film 31 according to an embodiment of the present disclosure may be a tape carrier package (TCP) or a chip-on film (COF).

Each of the plurality of driving ICs 33 may be individually mounted on (or at) a corresponding flexible circuit film 31 of the plurality of flexible circuit films 31. Each of the plurality of driving ICs 33 may receive pixel data and a data control signal provided from the timing controller 37, convert the pixel data into a pixel-based analog data voltage according to a data control signal, and supply the analog data voltage to a corresponding pixel P. For example, each of the plurality of driving ICs 33 may generate a plurality of grayscale voltages by using a plurality of reference gamma voltages provided from the PCB 35 and may select, as a pixel-based data voltage, a grayscale voltage corresponding to pixel data from among the plurality of grayscale voltages to output the selected data voltage.

Additionally, each of the plurality of driving ICs 33 may generate a pixel driving power (or a pixel driving voltage) and a pixel common voltage (or a cathode voltage) needed for driving (or light emitting) of the pixels P by using the plurality of reference gamma voltages. As an embodiment, each of the plurality of driving ICs 33 may select, as the pixel driving power and a pixel common voltage, a predetermined reference gamma voltage or a predetermined grayscale voltage from among the plurality of reference gamma voltages or the plurality of grayscale voltages to output the pixel driving power and the pixel common voltage.

Moreover, each of the plurality of driving ICs 33 may additionally generate and output a reference voltage on the basis of a driving (or operating) method of each pixel P. For example, each of the plurality of driving ICs 33 may select, as a reference voltage, a predetermined reference gamma voltage or a predetermined grayscale voltage from among the plurality of reference gamma voltages or the plurality of grayscale voltages to output the reference voltage. For example, the pixel driving power, the pixel common voltage, and the reference voltage may have different voltage levels.

Each of the plurality of driving ICs 33 may sequentially sense a characteristic value of a driving TFT configured in the pixel P through the plurality of reference voltage lines disposed on the substrate 100, generate sensing raw data corresponding to a sensing value, and provide the sensing raw data to the timing controller 37.

The PCB 35 may be connected to the other edge portion of each of the plurality of flexible circuit films 31. The PCB 35 may transfer a signal and a voltage between elements of the driving circuit unit 30.

The timing controller 37 may be mounted on the PCB 35 and may receive image data and a timing synchronization signal provided from the display driving system through a user connector disposed on the PCB 35. Alternatively, the timing controller 37 may not be mounted on the PCB 35 and may be configured in the display driving system or may be mounted on a separate control board connected between the PCB 35 and the display driving system.

The timing controller 37 may align the video data on the basis of the timing synchronization signal so as to match a pixel arrangement structure disposed in (or at) the display area AA and may be configured to provide the generated pixel data to each of the plurality of driving ICs 33.

According to an embodiment of the present disclosure, when the pixel P includes an emission area emitting white light, the timing controller 37 may extract white pixel data on the basis of the digital video data (for example, red input data, green input data, and blue input data which are to be respectively supplied to corresponding pixels P), reflect offset data based on the extracted white pixel data in each of the red input data, the green input data, and the blue input data to calculate red pixel data, green pixel data, and blue pixel data, and align the calculated red pixel data, green pixel data, and blue pixel data and the white pixel data according to the pixel arrangement structure to supply aligned pixel data to each of the driving ICs 33.

The timing controller 37 may generate each of the data control signal and the gate control signal on the basis of the timing synchronization signal, control a driving timing of each of the driving ICs 33 on the basis of the data control signal, and control a driving timing of the gate driving circuit 150 on the basis of the gate control signal. For example, the timing synchronization signal may include a vertical synchronization signal, a horizontal synchronization signal, a data enable signal, and a main clock (or a dot clock).

The data control signal according to an embodiment of the present disclosure may include a source start pulse, a source shift clock, and a source output signal, or the like. The gate control signal according to an embodiment of the present disclosure may include a start signal (or a gate start pulse) and a plurality of shift clocks, or the like.

The timing controller 37 may drive each of the driving ICs 33 and the gate driving circuit 150 on the basis of an external sensing mode during a predetermined external sensing period, generate compensation data for compensating for a characteristic variation of the driving TFT of each pixel P on the basis of the sensing raw data provided from the driving ICs 33, and modulate pixel data on the basis of the generated compensation data. For example, the timing controller 37 may drive each of the driving ICs 33 and the gate driving circuit 150 on the basis of the external sensing mode for each external sensing period corresponding to a blank period (or a vertical blank period) of the vertical synchronization signal. For example, the external sensing mode may be performed in a process of powering on the display apparatus, a process of powering off the display apparatus, a process of powering off the display apparatus after being driven for a long time, or a blank period of a frame which is set in real time or periodically. The external sensing mode of a display apparatus may be technology known to those skilled in the art, and thus, its detailed description is omitted. Alternatively, an internal sensing mode may be performed for the display apparatus according to an example embodiment of the present disclosure so as to internally compensate for a characteristic variation of the driving TFT of each pixel P, and the present disclosure is not limited thereto.

The power circuit part 39 may be mounted on the PCB 35 and may generate various source voltages needed for displaying an image on the pixels P by using an input power supplied from the outside to provide the generated source voltage to a corresponding circuit. For example, the power circuit part 39 may generate and output a logic source voltage needed for driving of each of the timing controller 37 and the driving ICs 33, the plurality of reference gamma voltages provided to the driving ICs 33, and at least one gate driving power and at least one gate common power needed for driving of the gate driving circuit 150. The gate driving power and the gate common power may have different voltage levels.

Figure 4:
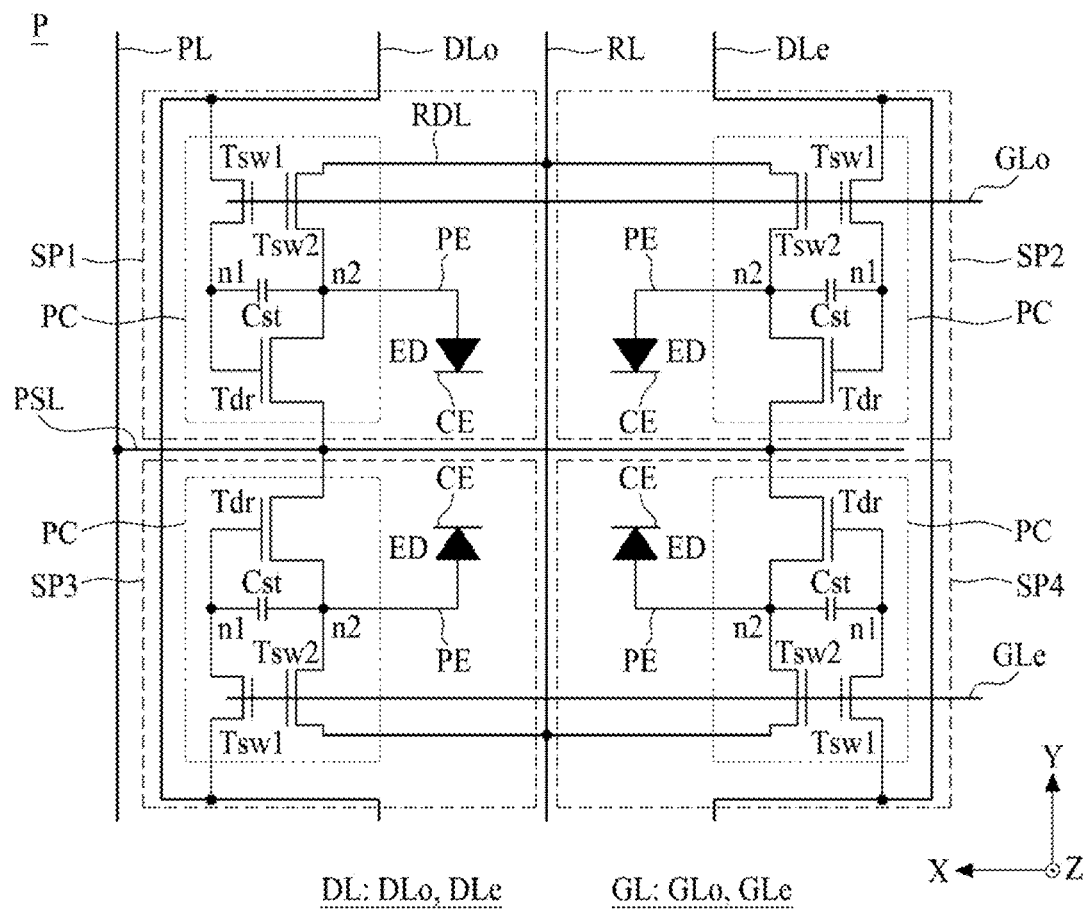
FIG. 4 is a circuit diagram illustrating one pixel illustrated in FIG. 3.

FIG. 3 is an enlarged view of a region 'A' illustrated in FIG. 2. FIG. 4 is a circuit diagram illustrating one pixel illustrated in FIG. 3. FIGS. 3 and 4 are diagrams for describing pixels according to an embodiment of the present disclosure.

Referring to FIGS. 2 to 4, a substrate (or a display area) 100 according to an embodiment of the present disclosure may include a plurality of gate lines GL, a plurality of data lines DL, a plurality of pixel driving power lines PL, a plurality of pixel common voltage lines CVL, a plurality of pixels P, a common electrode CE, a plurality of common electrode contact portions CECP, and a pad part 110.

Each of the plurality of gate lines GL may extend long along a first direction X and may be disposed at the display area AA of the substrate 100 to have a predetermined interval along a second direction Y.

Each of the plurality of data lines DL may extend long along the second direction Y and may be disposed at the display area AA of the substrate 100 to have a predetermined interval along the first direction X.

Each of the plurality of pixel driving power lines PL may extend long along the second direction Y and may be disposed at the display area AA of the substrate 100 to have a predetermined interval along the first direction X.

Two adjacent pixel driving power lines PL among the plurality of pixel driving power lines PL may be connected to a plurality of power sharing lines PSL disposed at each of pixel areas PA arranged along the second direction Y. For example, the plurality of pixel driving power lines PL may be electrically connected to one another by the plurality of power sharing lines PSL, and thus, may have a ladder structure or a mesh structure. The plurality of pixel driving power lines PL may have a ladder structure or a mesh structure, and thus, the voltage drop (IR drop) of the pixel driving power caused by a line resistance of each of the plurality of pixel driving power lines PL may be reduced, prevented or minimized. Accordingly, the display apparatus 10 according to an embodiment of the present disclosure may reduce, prevent or minimize the degradation in image quality caused by a deviation of the pixel driving power supplied to each of the pixels P arranged at the display area AA.

Each of the plurality of power sharing lines PSL may branch from an adjacent pixel driving power line PL in parallel with the first direction X and may be disposed in a middle region of each pixel area PA.

Each of the plurality of pixel common voltage lines CVL may extend long in the second direction Y and may be disposed at the display area AA of the substrate 100 to have a predetermined interval in the first direction X.

Each of the plurality of pixels P may be respectively disposed in (or at) the plurality of pixel areas PA which is defined to have an equal size in (or at) the display area AA of the substrate 100.

Each of the plurality of pixels P may include at least three subpixels. For example, each of the plurality of pixels P may include first to fourth subpixels SP1 to SP4.

The first subpixel SP1 may be disposed in (or at) a first subpixel area of the pixel area PA, the second subpixel SP2 may be disposed in (or at) a second subpixel area of the pixel area PA, the third subpixel SP3 may be disposed in (or at) a third subpixel area of the pixel area PA, and the fourth subpixel SP4 may be disposed in (or at) a fourth subpixel area of the pixel area PA. For example, with respect to the central portion of the pixel P, the first subpixel SP1 may be a left upper subpixel area of the pixel area PA, the second subpixel SP2 may be a right upper subpixel area of the pixel area PA, the third subpixel SP3 may be a left lower subpixel area of the pixel area PA, and the fourth subpixel SP4 may be a right lower subpixel area of the pixel area PA.

Each of the first to fourth subpixels SP1 to SP4 may include a pixel circuit PC and a light emitting device layer.

The pixel circuit PC according to an embodiment of the present disclosure may be disposed in (or at) a circuit area CA of the pixel area PA and may be connected to gate lines GLo and GLe adjacent thereto, data lines DLo and DLe adjacent thereto, and the pixel driving power line PL adjacent thereto. For example, a pixel circuit PC disposed in (or at) the first subpixel SP1 may be connected to an odd-numbered data line DLo and an odd-numbered gate line GLo, a pixel circuit PC disposed in (or at) the second subpixel SP2 may be connected to an even-numbered data line DLe and an odd-numbered gate line GLo, a pixel circuit PC disposed in (or at) the third subpixel SP3 may be connected to an odd-numbered data line DLo and an even-numbered gate line GLe, and a pixel circuit PC disposed in (or at) the fourth subpixel SP4 may be connected to an even-numbered data line DLe and an even-numbered gate line GLe.

The pixel circuit PC of each of the first to fourth subpixels SP1 to SP4 may sample a data signal supplied from corresponding data lines DLo and DLe in response to a scan signal supplied from corresponding gate lines GLo and GLe and may control a current flowing from the pixel driving power line PL to the light emitting device ED on the basis of a sampled data signal.

The display apparatus 10 according to an embodiment of the present disclosure may further include a plurality of reference voltage lines RL.

The plurality of reference voltage lines RL may extend long along the second direction Y and may be disposed at the display area AA of the substrate 100 to have a predetermined interval along the first direction X. Each of the plurality of reference voltage lines RL may be disposed at a center region of each of the pixel areas PA arranged along the second direction Y, but embodiments of the present disclosure are not limited thereto. For example, each of the plurality of reference voltage lines RL may be disposed between an odd-numbered data line DLo and an even-numbered data line DLe in each pixel area PA.

Each of the plurality of reference voltage lines RL may be shared by two adjacent subpixels ((SP1, SP2) or (SP3, SP4)) along the first direction X in each pixel area PA. To this end, each of the plurality of reference voltage lines RL may include a reference branch line RDL.

The reference branch line RDL may branch (or protrude) toward the two adjacent subpixels ((SP1, SP2) or (SP3, SP4)) along the first direction X in each pixel area PA and may be electrically connected to the two adjacent subpixels ((SP1, SP2) or (SP3, SP4)).

The pad part 110 according to an embodiment of the present disclosure may further include a plurality of reference power pads RVP.

Each of the plurality of reference power pads RVP may be individually (or a one-to-one relationship) connected to one end of a corresponding reference voltage line RL of the plurality of reference voltage lines RL. For example, each of the plurality of reference power pads RVP may be disposed between two data pads DP disposed in (or at) each of a plurality of outermost pixel areas PA, but embodiments of the present disclosure are not limited thereto. Optionally, the plurality of reference voltage lines RL, the plurality of reference power pads RVP, and the reference branch line RDL may each be omitted based on a circuit configuration of the pixel circuit PC.

The pixel circuit PC according to an embodiment of the present disclosure may include a first switching thin film transistor Tsw1, a second switching thin film transistor Tsw2, a driving thin film transistor Tdr, and a storage capacitor Cst, but embodiments of the present disclosure are not limited thereto. For example, 4T1C, 3T2C, 4T2C, 5T2C, 6T2C, 7T1C, 7T2C, 8T2C structures, etc. are also possible. And more or less transistors and capacitors could be included. In the following description, a thin film transistor may be referred to as a TFT.

At least one of the first switching TFT Tsw1, the second switching TFT Tsw2, and the driving TFT Tdr may be an N-type or P-type TFT. At least one of the first switching TFT Tsw1, the second switching TFT Tsw2, and the driving TFT Tdr may be an amorphous silicon (a-Si) TFT, a poly-Si TFT, an oxide TFT, or an organic TFT. For example, in the pixel circuit PC, some of the first switching TFT Tsw1, the second switching TFT Tsw2, and the driving TFT Tdr may be a TFT including a semiconductor layer (or an active layer) including low-temperature poly silicon (LTPS) having an excellent response characteristic, and the other of the first switching TFT Tsw1, the second switching TFT Tsw2, and the driving TFT Tdr may be a TFT including a semiconductor layer (or an active layer) including oxide which is good in off current characteristic. The first switching TFT Tsw1, the second switching TFT Tsw2, and the driving TFT Tdr may have different sizes (or channel sizes). For example, the driving TFT Tdr may have a size which is greater than that of each of the first switching TFT Tsw1 and the second switching TFT Tsw2, and the second switching TFT Tsw2 may have a size which is greater than that of the first switching TFT Tsw1.

The first switching TFT Tsw1 may include a gate electrode connected to a corresponding gate line GLo or GLe, a first electrode connected to a corresponding data line DLo or DLe, and a second electrode connected to a gate node n1 of the driving TFT Tdr. The first switching TFT Tsw1 may supply a data signal, supplied through a corresponding data line DL based on a scan signal supplied through the corresponding gate line GLo or GLe, to the gate node n1 of the driving TFT Tdr.

The second switching TFT Tsw2 may include a gate electrode connected to a corresponding gate line GLo or GLe, a first electrode connected to a source node n2 of the driving TFT Tdr, and a second electrode connected to a corresponding reference voltage line RL. The second switching TFT Tsw2 may supply a reference voltage, supplied through the corresponding reference line RL based on a scan signal supplied through the corresponding gate line GLo or GLe, to the source node n2 of the driving TFT Tdr.

The storage capacitor Cst may be formed between the gate node n1 and the source node n2 of the driving TFT Tdr. The storage capacitor Cst may be charged with a difference voltage between the gate node n1 and the source node n2 of the driving TFT Tdr, and then, may turn on or off the driving TFT Tdr based on a charged voltage thereof.

The driving TFT Tdr may include a gate electrode (or the gate node n1) connected to the second electrode of the first switching TFT Tsw1 and a first capacitor electrode of the storage capacitor Cst in common, a first electrode (or the source node n2) connected to the first electrode of the second switching TFT Tsw2, a second capacitor electrode of the storage capacitor Cst, and the light emitting device layer in common, and a second electrode (or a drain node) connected to a corresponding pixel driving power line PL. The driving TFT Tdr may be turned on based on a voltage of the storage capacitor Cst and may control the amount of current flowing from the pixel driving power line PL to the light emitting device layer.

The second switching TFT Tsw2 disposed at the pixel circuit PC of each of the first to fourth subpixels SP1 to SP4 may supply a reference voltage to the source node n2 of the driving TFT Tdr through the reference voltage line RL during a data charging period (or section) of the pixel P based on an external sensing mode and may supply a current, flowing in the source electrode n2 of the driving TFT Tdr, to the reference voltage line RL during a sensing period (or section) of the pixel P, and in this case, the driving circuit unit 30 may sense the current supplied to the reference voltage line RL to generate compensation data for compensating for a characteristic variation of the driving TFT Tdr and may modulate pixel data on the basis of the generated compensation data. For example, the characteristic variation of the driving TFT Tdr may include a threshold voltage and/or mobility.

Optionally, in each of the first to fourth subpixels SP1 to SP4, the pixel circuit PC including the first switching TFT Tsw1, the second switching TFT Tsw2, the storage capacitor Cst, and the driving TFT Tdr may be implemented as a pixel driving chip type (or a semiconductor integrated circuit), disposed in (or at) a circuit area CA of a corresponding pixel area PA, and connected to gate lines GLo and GLe adjacent thereto, data lines DLo and DLe adjacent thereto, and the pixel driving power line PL adjacent thereto. For example, a pixel driving chip according to an embodiment of the present disclosure may be a microchip or a chip set which corresponds to a minimum unit and may be a semiconductor packaging device which has a fine size including two or more transistors and one or more capacitors. The pixel driving chip may sample a data signal supplied through corresponding data lines DLo and DLe in response to the scan signal supplied through corresponding gate lines GLo and GLe and may control a current flowing from the pixel driving power line PL to the light emitting device layer based on the sampled data signal.

The light emitting device layer may be disposed in (or at) the emission area EA of the pixel area PA and electrically connected to the pixel circuit PC.

The light emitting device layer according to an embodiment of the present disclosure may include a pixel electrode PE electrically connected to the pixel circuit PC, a common electrode CE electrically connected to the pixel common voltage line CVL, and the light emitting device ED interposed between the pixel electrode PE and the common electrode CE.

The pixel electrode PE may be referred to as an anode electrode, a reflective electrode, a lower electrode, or a first electrode of the light emitting device ED. The pixel electrode PE according to an embodiment of the present disclosure may include a metal material which is high in work function and is good in reflective efficiency. For example, the pixel electrode PE may be formed in a three-layer structure of IZO/MoTi/ITO or ITO/MoTi/ITO, or may be formed in a four-layer structure of ITO/Cu/MoTi/ITO, but embodiments of the present disclosure are not limited thereto. In another example, the pixel electrode PE may have a multilayer structure including a transparent conductive film and an opaque conductive film having high reflective efficiency. The transparent conductive film may be made of a material having a relatively high work function value such as indium-tin-oxide (ITO) or indium-zinc-oxide (IZO), and the opaque conductive film may have a single-layer or multi-layer structure including Al, Ag, Cu, Pb, Mo, Ti or an alloy thereof.

The pixel electrode PE may overlap the emission area EA of each of the plurality of pixel areas PA. The pixel electrode PE may be patterned in an island shape, may be disposed in (or at) each pixel area PA, and may be electrically connected to the first electrode of the driving TFT Tdr of a corresponding pixel circuit PC.

The light emitting device ED may be formed on the pixel electrode PE and may directly contact the pixel electrode PE. The light emitting device ED may be a common device or common device layer which is formed in common in (or at) each of a plurality of subpixels SP so as not to be distinguished by subpixel SP units. The light emitting device ED may react on a current flowing between the pixel electrode PE and the common electrode CE to emit white light or blue light. The light emitting device ED may be an organic light emitting device or an inorganic light emitting device, and the present disclosure is not limited thereto.

The common electrode CE may be disposed over the display area AA of the substrate 100 and may be electrically and commonly connected to the light emitting device ED of each of the plurality of subpixels SP. For example, the common electrode CE may be disposed in (or at) a region, other than a pad part 110 disposed in (or at) the substrate 100, of the display area AA of the substrate 100

Each of the plurality of common electrode contact portions CECP may be disposed between the plurality of pixels P respectively overlapping the plurality of pixel common voltage lines CVL and may be electrically connected to (or contact) the common electrode CE to each of the plurality of pixel common voltage lines CVL. With respect to one or more direction of the first direction X and the second direction Y, each of the plurality of common electrode contact portions CECP according to an embodiment of the present disclosure may be electrically connected to each of the plurality of pixel common voltage lines CVL in (or at) a portion between two adjacent pixel groups and may be electrically connected to a portion of the common electrode CE, and thus, may be electrically connected to the common electrode CE to each of the plurality of pixel common voltage lines CVL. For example, the common electrode CE may be electrically connected to each of the plurality of common electrode contact portions CECP by a side contact structure corresponding to an undercut structure. For example, the plurality of pixels P may be classified or grouped into a plurality of pixel groups. One pixel group may include two or more adjacent pixels P along one or more directions of the first direction X and the second direction Y.

Each of the plurality of common electrode contact portions CECP may be disposed between two adjacent pixels P of the plurality of pixels P to electrically connect the common electrode CE to each of the plurality of pixel common voltage lines CVL, and thus, may reduce, prevent or minimize the voltage drop (IR drop) of the pixel common voltage caused by a surface resistance of the common electrode CE. Accordingly, the display apparatus 10 according to an embodiment of the present disclosure may reduce, prevent or minimize the degradation in image quality caused by a deviation of the pixel common voltage supplied to each of the pixels P arranged in (or at) the display area AA.

According to an embodiment of the present disclosure, each of the plurality of common electrode contact portions CECP may be formed together with the pixel electrode PE having at least three-layer structure so as to be electrically connected to each of the plurality of pixel common voltage lines CVL. Each of the plurality of common electrode contact portions CECP may be electrically connected to the common electrode CE through a side contact structure having a "("-shaped cross-sectional structure or a "<"-shaped cross-sectional structure. For example, when each of the plurality of common electrode contact portions CECP is formed of three or more metal layers, each of the plurality of common electrode contact portions CECP may include a side contact structure corresponding to an undercut structure or a tapered structure which is formed on the lateral surface of one or more intermediate metal layer by an etching speed between three or more metal layers The pad part 110 may be disposed at a first periphery portion among the first surface of the substrate 100 parallel to the first direction X. The pad part 110 may be disposed at a third periphery portion of each of outermost pixel areas PA disposed at the first periphery portion of the substrate 100. With respect to the second direction Y, an end of the pad part 110 may overlap or may be aligned with an end of each of the outermost pixel areas. Therefore, the pad part 110 may be included (or disposed) in each of the outermost pixel areas disposed at the first periphery portion of the substrate 100, and thus, a non-display area (or a bezel area) based on the pad part 110 may not be formed or may not be on the substrate 100.

The pad part 110 according to an embodiment of the present disclosure may include a plurality of first pads which are disposed in parallel with one another along the first direction X on the first periphery portion of the substrate 100.

The pad part 110 according to an embodiment of the present disclosure may include a plurality of pad groups PG which are arranged in the order of a pixel driving power pad PVP, two data pads DP, a gate pad GP, a pixel common voltage pad CVP, two data pads DP, and a pixel driving power pad PVP along the first direction X, but the present disclosure is not limited thereto.

Each of the plurality of pad groups PG may be connected to two adjacent pixels P disposed along the first direction X. For example, each of the plurality of pad groups PG may include a first pad group PG1 and a second pad group PG2. The first pad group PG1 may include one pixel driving power pad PVP, two data pads DP, and one gate pad GP continuously disposed in (or within) an odd-numbered pixel area PA along the first direction X. The second pad group PG2 may include one pixel common voltage pad CVP, two data pads DP, and one pixel driving power pad PVP continuously disposed in (or within) an even-numbered pixel area PA along the first direction X.

The substrate 100 according to an embodiment of the present disclosure may further include a plurality of secondary voltage lines SVL and a plurality of secondary voltage contact portions SVCP.

Each of the plurality of secondary voltage lines SVL may extend long along the second direction Y and may be disposed adjacent to a corresponding pixel common voltage line CVL of the plurality of pixel common voltage lines CVL. Each of the plurality of secondary voltage lines SVL may be electrically connected to an adjacent pixel common voltage line CVL without being electrically connected to the pixel common voltage pad CVP and may be supplied with a pixel common voltage through the adjacent pixel common voltage line CVL. To this end, the substrate 100 according to an embodiment of the present disclosure may further include a plurality of line connection patterns LCP which electrically connect a pixel common voltage line CVL and a secondary voltage line SVL adjacent to each other. Each of the plurality of line connection patterns LCP may be disposed on the substrate 100 so that a pixel common voltage line CVL and a secondary voltage line SVL adjacent to each other intersect with each other and may electrically connect a pixel common voltage line CVL and a secondary voltage line SVL adjacent to each other by using a line jumping structure.

Each of the plurality of secondary voltage contact portions SVCP may be disposed in parallel with each of the plurality of common electrode contact portions CECP and may electrically connect the common electrode CE to each of the plurality of secondary voltage lines SVL. Therefore, the common electrode CE may be additionally connected to each of the plurality of secondary voltage lines SVL through the plurality of secondary voltage contact portions SVCP. Accordingly, the display apparatus 10 according to an embodiment of the present disclosure may reduce, prevent or minimize the degradation in image quality caused by a deviation of the pixel common voltage supplied to each of the pixels P arranged in (or at) the display area AA. Also, in the display apparatus 10 according to the present disclosure, although the pixel common voltage pad CVP connected to each of the plurality of secondary voltage lines SVL is not additionally disposed (or formed), the pixel common voltage may be supplied to the common electrode CE in (or at) each of the plurality of pixel areas PA.

Each of the plurality of secondary voltage contact portions SVCP may electrically connect a corresponding secondary voltage line of the plurality of secondary voltage lines SVL to the common electrode CE through a side contact structure having a "("-shaped cross-sectional structure or a "<"-shaped cross-sectional structure, like each of the plurality of common electrode contact portions CECP.

Figure 5:
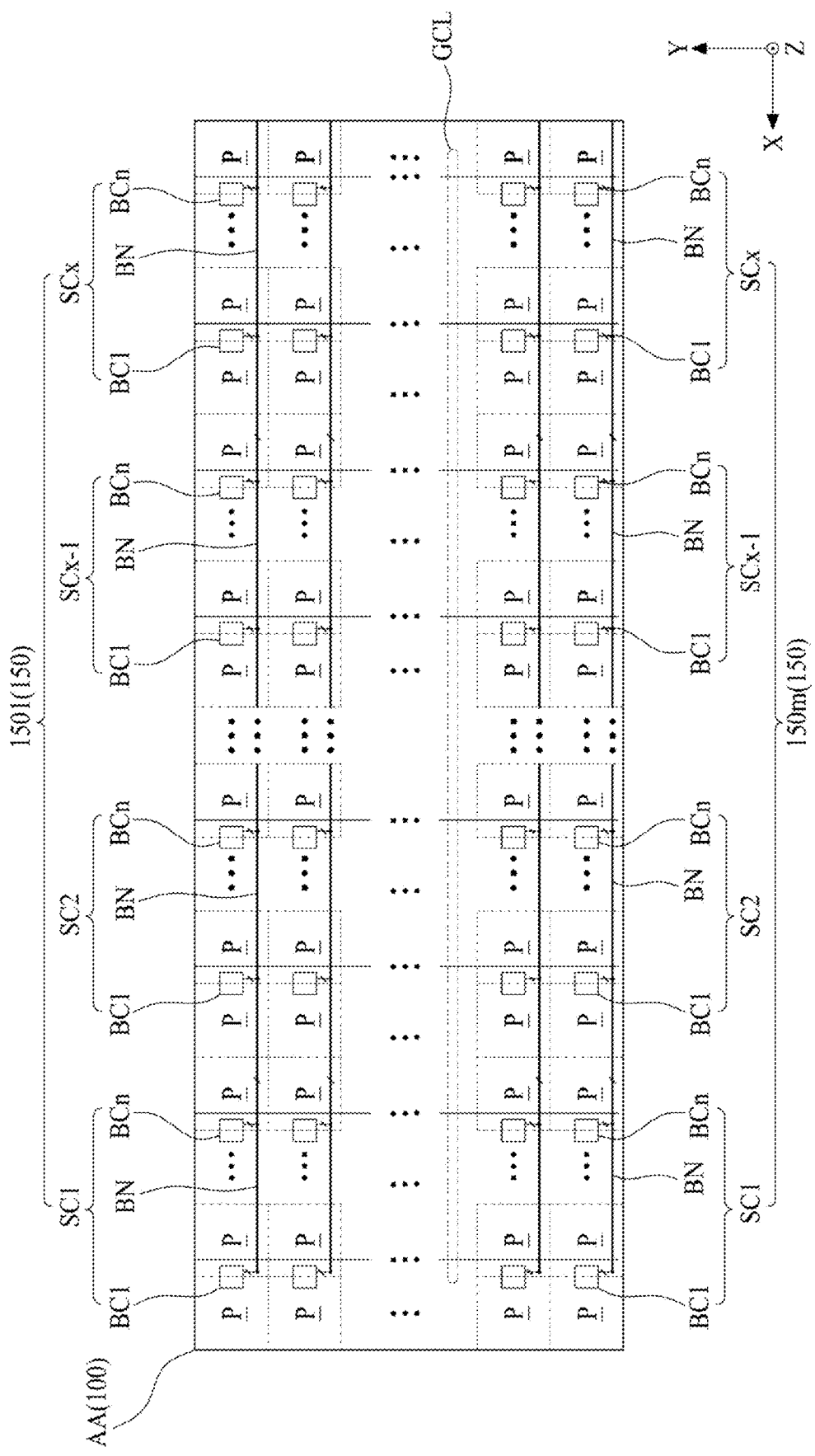
FIG. 5 is a diagram illustrating a gate driving circuit according to an embodiment of the present disclosure illustrated in FIGS. 2 and 3.
Figure 6:
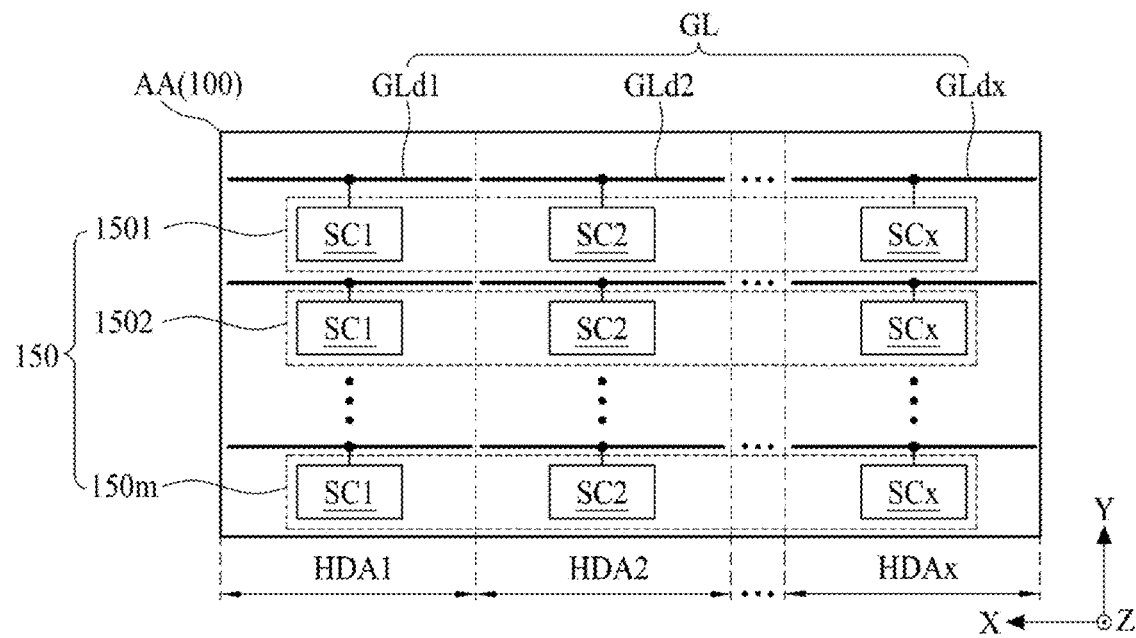
FIG. 6 is a diagram illustrating gate lines connected to a plurality of stage circuit units illustrated in FIG. 5.

FIG. 5 is a diagram illustrating a gate driving circuit according to an embodiment of the present disclosure illustrated in FIGS. 2 and 3. FIG. 6 is a diagram illustrating gate lines connected to a plurality of stage circuit units illustrated in FIG. 5.

Referring to FIGS. 2, 3, 5, and 6, the gate driving circuit 150 according to an embodiment of the present disclosure may be configured to include a shift register including a plurality of stage circuit units 1501 to 150*m*.

Each of the plurality of stage circuit units 1501 to 150*m* may be individually disposed in (or within) each horizontal line on a first surface of the substrate 100 along a first direction X, and the plurality of stage circuit units 1501 to 150*m* may be dependently connected to one another along a second direction Y. Each of the plurality of stage circuit units 1501 to 150*m* may generate a scan signal in a predetermined order in response to a gate control signal supplied through a pad part 110 and a plurality of gate control line GCL and may supply the scan signal to a corresponding gate line GL. For example, a plurality of gate control lines GCL may include a start signal line, a plurality of scan shift clock lines, a plurality of carry shift clock lines, one or more gate driving power line, and one or more gate common power line. For example, the plurality of gate control lines GCL may be a plurality of scan control lines, a plurality of first gate control lines, or a plurality of vertical control lines.

Driving of each of the plurality of stage circuit units 1501 to 150*m* according to an embodiment of the present disclosure may start based on a carry signal (or a set carry signal) supplied from two or more previous stage circuit units and may be reset based on the carry signal (or a reset carry signal) supplied from two or more next stage circuit units. For example, driving of each of first to fourth stage circuit units 1501 to 1504 may start respectively based on first to fourth gate start signals supplied from the timing controller, and driving of each of m–3$^{th}$ to m$^{th}$ stage circuit units 150*m*-3 to 150*m* may be reset respectively based on first to fourth reset signals supplied from the timing controller. For example, driving of odd-numbered stage circuit units of the plurality of stage circuit units 1501 to 150*m* may start based on the carry signal supplied from previous odd-numbered stage circuit units and may be reset based on the carry signal supplied from next odd-numbered stage circuit units. For example, driving of even-numbered stage circuit units of the plurality of stage circuit units 1501 to 150*m* may start based on the carry signal supplied from previous even-numbered stage circuit units and may be reset based on the carry signal supplied from next even-numbered stage circuit units.

Each of the plurality of stage circuit units 1501 to 150*m* according to an embodiment of the present disclosure may include first to x$^{th}$ (where x is a natural number of 2 or more) stage circuits SC1 to SCx.

The first to x$^{th}$ stage circuits SC1 to SCx may be respectively disposed in (or within) first to x$^{th}$ horizontal division regions HDA1 to HDAx defined in each horizontal line of a display area AA along the first direction X. Each of the first to x$^{th}$ stage circuits SC1 to SCx may generate the scan signal in a predetermined order in response to the gate control signal supplied through the pad part 110 and the gate control line GCL and may simultaneously supply the scan signal to a corresponding gate line GL.

Each of the plurality of gate lines GL according to an embodiment of the present disclosure may include first to x$^{th}$ gate division lines GLd1 to GLdx which are respectively disposed in (or at) the first to x$^{th}$ horizontal division regions HDA1 to HDAx of each horizontal line with respect to the first direction X and are electrically disconnected from one another. In this case, a plurality of pixels P disposed in (or at) each of the first to x$^{th}$ horizontal division regions HDA1 to HDAx may be commonly connected to the first to x$^{th}$ gate division lines GLd1 to GLdx disposed in (or at) corresponding horizontal division regions HDA1 to HDAx. For example, a plurality of pixels P disposed in (or at) the first horizontal division region HDA1 may be commonly connected to the first gate division line GLd1 disposed in (or at) the first horizontal division region HDA1.

Each of a plurality of gate lines GL according to another embodiment of the present disclosure may be configured as a line type which connects continuously from one side of each horizontal line to the other side of each horizontal line, with respect to the first direction X. In this case, a plurality of pixels P disposed in (or at) each horizontal line may be connected to one gate line GL in common.

Each of the plurality of stage circuit units 1501 to 150$m$ according to an embodiment of the present disclosure may include a plurality of branch circuits BC1 to BCn and a branch network BN. For example, each of the first to $x^{th}$ stage circuits SC1 to SCx may include a plurality of branch circuits BC1 to BCn and a branch network BN Each of the plurality of branch circuits BC1 to BCn may be selectively connected to lines of the gate control line GCL through a branch network BN and may be electrically connected to one another through the branch network BN. Each of the plurality of branch circuits BC1 to BCn may generate the scan signal on the basis of the gate control signal supplied through each line of the gate control line GCL and the branch network BN and a signal transferred between branch networks BN and may supply the scan signal to a corresponding gate line GL.

Each of the plurality of branch circuits BC1 to BCn may be disposed in (or at) a region between two adjacent pixels P or a region between one or more pixels P along the first direction X, in each horizontal line of the substrate 100, but embodiments of the present disclosure are not limited thereto. For example, the plurality of branch circuits BC1 to BCn may be separately disposed (or distributedly disposed, or disposed in array) between a plurality of pixels P on the basis of the number of TFTs configuring one stage circuit unit 1501 to 150$m$ and the number of pixels P disposed in (or at) one horizontal line.

Each of the plurality of branch circuits BC1 to BCn according to an embodiment of the present disclosure may include one or more thin film transistors (TFTs) of a plurality of TFTs configuring one stage circuit SC1 to SCx. For example, an $i^{th}$ branch circuit BCi of the plurality of branch circuits BC1 to BCn may include one TFT, and a $j^{th}$ branch circuit BCj of the plurality of branch circuits BC1 to BCn may include two TFTs, but embodiments of the present disclosure are not limited thereto.

The branch network BN may be configured to electrically connect the plurality of branch circuits BC1 to BCn which are disposed in (or at) each horizontal line of the substrate 100. The branch network BN may be disposed in (or at) a region between the plurality of pixels P or a region between one or more pixels P along the second direction Y. For example, the branch network BN may be disposed in (or at) a transmissive part TP between emission parts EP of any two of the plurality of pixels P arranged along the second direction Y.

With respect to the second direction Y, the display area AA may include first to mt h horizontal lines, and the branch network BN may be disposed at (or in) the same position of each of the first to $m^{th}$ horizontal lines. The branch network BN may be disposed in (or at) a lower edge region (or an upper edge region) of each of pixel areas arranged in (or at) each of the first to $m^{th}$ horizontal lines, so as to reduce, minimize a transmittance deviation between transmissive parts TP of each of the first to mt h horizontal lines. For example, the branch network BN may be disposed in (or at) the lower edge region of each of the pixel areas arranged in (or at) each of the first to $m^{th}$ horizontal lines. For example, the branch network BN may be disposed in (or at) a transmissive part TP in (or at) a lower side of an emission part EP of each of pixels P which is arranged in (or at) each of the first to $m^{th}$ horizontal lines, but embodiments of the present disclosure are not limited thereto. Accordingly, positions of branch networks BN disposed in (or at) the transmissive part TP of each of a plurality of pixels P may be the same or regular, and thus, a transmittance deviation between horizontal lines caused by the branch network BN disposed in the transmissive part TP may be reduced, minimized or prevented.

According to an embodiment of the present disclosure, the branch network BN may include a transparent conductive material capable of transmitting light. Accordingly, the branch network BN may include a transparent conductive material, and thus, a light transmission rate (or transmittance) of a transmissive part TP may be increased or enhanced by light passing through the branch network BN, thereby enhancing or increasing a total light transmission rate (or transmittance) of the display area AA.

According to an embodiment of the present disclosure, the branch network BN may be disposed between one edge portion and the other edge portion of each horizontal line of the substrate 100. For example, the branch network BN may be disposed in (or at) the transmissive part TP of each of the plurality of pixels P, and in order to reduce, minimize a transmittance deviation of the transmissive part TP of each of the plurality of pixels P, the branch network BN may extend up to an edge portion of an outermost pixel in (or at) each horizontal line of the substrate 100. Accordingly, a deviation between a light transmission rate (or transmittance) of a transmissive part TP of a pixel P where the branch network BN is provided and a light transmission rate (or transmittance) of a transmissive part TP of a pixel P where the branch network BN is not provided may be reduced, minimized or prevented.

The branch network BN may be configured to be electrically connected to one or more of the plurality of branch circuits BC1 to BCn and the gate control line GCL. For example, the branch network BN may be a branch connection portion, a branch circuit connection portion, an internal circuit connection portion, an internal circuit connection line portion, an internal signal transfer portion, an internal signal transfer line portion, or an internal bridge line portion.

The branch network BN according to an embodiment of the present disclosure may include a plurality of control nodes and a plurality of network lines, or may include a plurality of circuit connection lines which are arranged at a certain interval in parallel. For example, each of the plurality of circuit connection lines may be a branch connection line, a branch circuit connection line, an internal circuit connection line, an internal signal transfer line, or an internal bridge line.

The plurality of control nodes may be disposed at (or within) each horizontal line of the substrate 100 and may be selectively connected to the plurality of branch circuits BC1 to BCn in one horizontal line. For example, each of the plurality of control nodes may be electrically connected to gate electrodes of one or more TFTs in (or at) one or more branch circuits configured in (or at) each of an inverter circuit and an output buffer circuit of the stage circuit unit. Also, each of the plurality of control nodes may be electrically connected to any one of gate electrodes, first electrodes, and second electrodes of one or more TFTs in (or at) one or more branch circuits configured in (or at) each of a node reset circuit and a node control circuit configuring the stage circuit unit.

Each of the plurality of network line may be selectively connected to the plurality of branch circuits BC1 to BCn. Each of the plurality of network lines may be configured to connect one or more TFTs, configured in (or at) each of the plurality of branch circuits BC1 to BCn, with each other. For example, the network line may include one or more of a jumping line, a bridge line, a vertical line pattern, and a horizontal line pattern.

Figure 7:
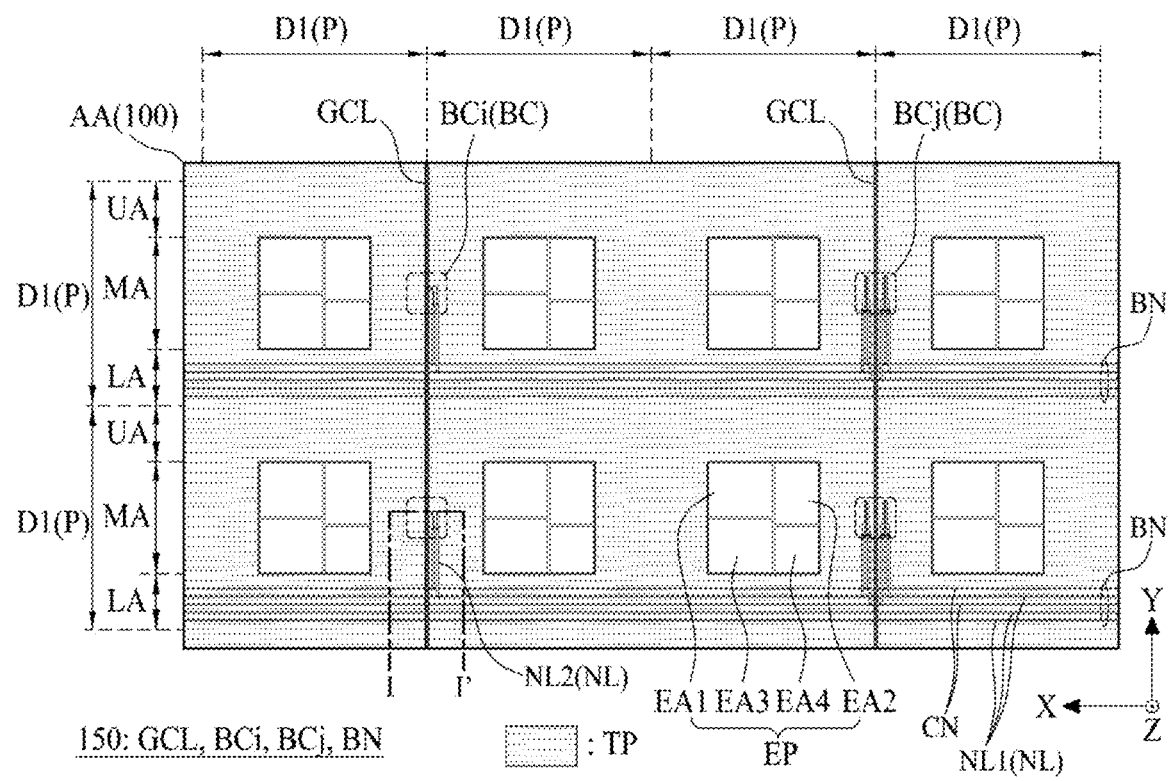
FIG. 7 is a diagram for describing a plurality of branch circuits and branch networks according to an embodiment of the present disclosure.
Figure 12:
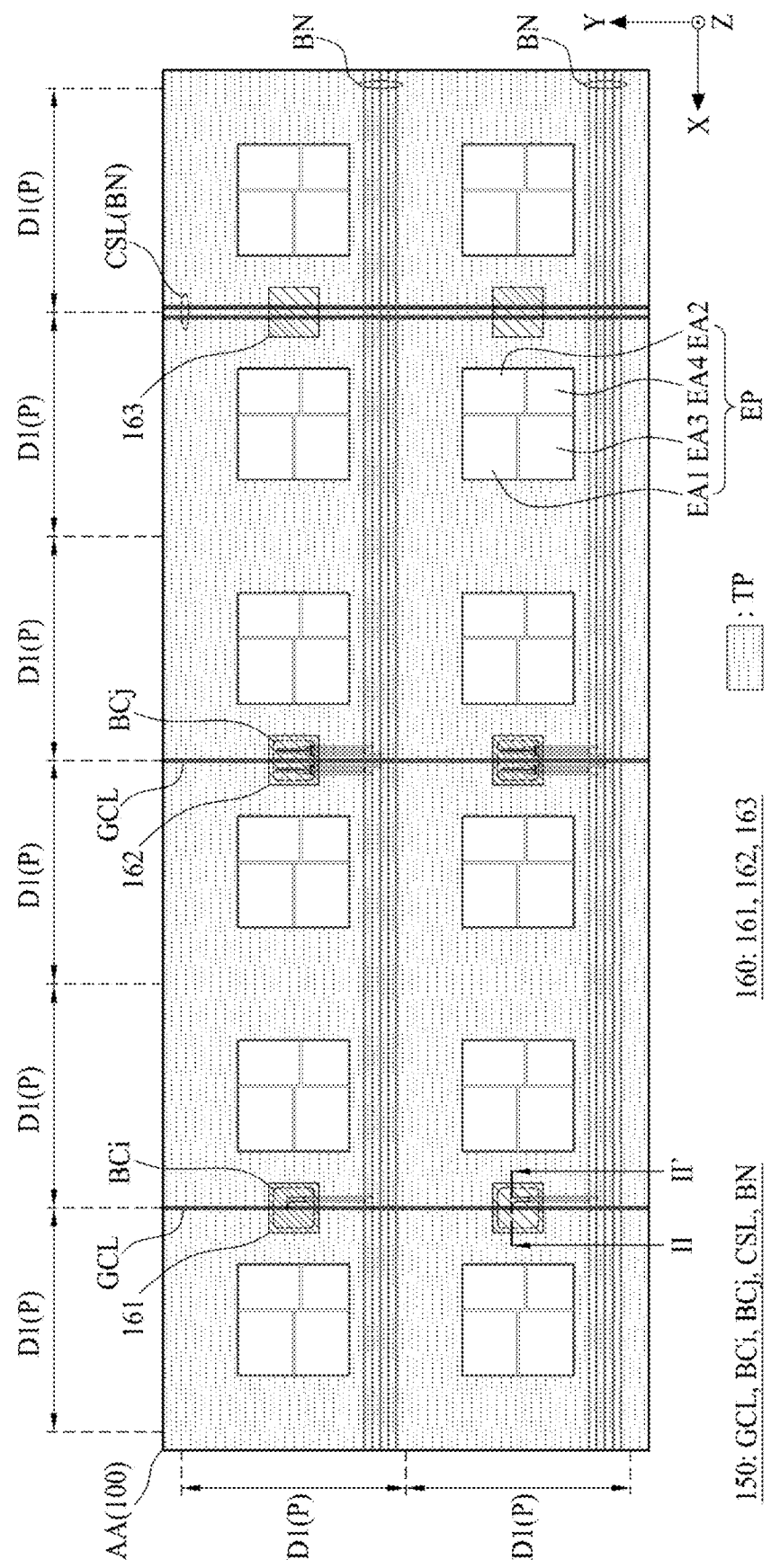
FIG. 12 is a diagram for describing a plurality of dummy patterns according to an embodiment of the present disclosure.

According to an embodiment of the present disclosure, as illustrated in FIG. 7, a branch network BN may include a plurality of network lines NL and a plurality of carry signal lines CSL (see FIG. 12).

The plurality of network lines NL may include a plurality of first network lines NL1 and a plurality of second network lines NL2.

The plurality of first network lines NL1 may be configured to have a certain interval along a second direction Y in parallel with a first direction X. For example, the plurality of first network lines NL1 may be arranged in parallel with the plurality of control nodes CN. For example, each of the plurality of first network lines NL1 may be a horizontal network line or a horizontal line pattern. Each of the plurality of first network lines NL1 may be configured as a transparent conductive material.

Each of the plurality of second network lines NL2 may be configured to include one or more of a first linear line parallel to the first direction X, a second linear line parallel to the second direction Y, a nonlinear line, and a curved line. Each of the plurality of second network lines NL2 may be configured to be electrically connected between the first network line NL1 and a TFT. For example, the first network line NL1 and the second network line NL2 may be configured in different layers. For example, the second network line NL2 may be electrically connected to one or more of the first network line NL1, an electrode of the TFT, and the gate control line GCL through a contact hole or a via hole.

The plurality of carry signal lines CSL may be configured to transfer a carry signal between stage circuit units 1501 to 150*m* adjacent to one another along the second direction Y. For example, the plurality of carry signal lines CSL may be disposed between two pixels P adjacent to each other along the first direction X to have a certain interval along the second direction Y and may be electrically connected to one or more of the plurality of first network lines NL1.

The plurality of carry signal lines CSL may include a plurality of first carry signal lines and a plurality of second carry signal lines. For example, the plurality of carry signal lines CSL may be classified or grouped into the plurality of first carry signal lines and the plurality of second carry signal lines.

Each of the plurality of first carry signal lines may be disposed between two pixels P adjacent to each other along the first direction X to transfer a first carry signal between the stage circuit units 1501 to 150*m* adjacent to one another along the second direction Y. For example, the first carry signal may be a set signal, a set carry signal, or a previous carry signal. For example, the first carry signal line may be a set signal line, a set carry signal line, or a previous carry signal line.

Each of the plurality of second carry signal lines may be disposed between two pixels P adjacent to each other along the first direction X to transfer a second carry signal between the stage circuit units 1501 to 150*m* adjacent to one another along the second direction Y. For example, the second carry signal may be a reset signal, a reset carry signal, or a next carry signal. For example, the second carry signal line may be a reset signal line, a reset carry signal line, or a next carry signal line.

According to an embodiment of the present disclosure, each of first to $x^{th}$ stage circuits SC1 to SCx may include a node control circuit, an inverter circuit, a node reset circuit, and an output buffer circuit, which are configured by the plurality of branch circuits BC1 to BCn. For example, the node control circuit may include one or more branch circuits which are configured to control a voltage of each of the plurality of control nodes. The inverter circuit may include two or more branch circuits which are configured to oppositely control or discharge voltages of each of a first control node and one or more second control nodes of the plurality of control nodes. The output buffer circuit may include two or more branch circuits which are configured to output, as a scan signal, a scan shift clock supplied through a gate control line GL based on the voltage of the first control node.

According to another embodiment of the present disclosure, one or more part of first to $x^{th}$ stage circuits SC1 to SCx may configure a stage (or a shift register) including a node control circuit, an inverter circuit, and a node reset circuit configured by some of the plurality of branch circuits BC1 to BCn. The other, except some stage circuits configuring the stage, of the first to $x^{th}$ stage circuits SC1 to SCx may configure a plurality of output buffer circuits. For example, when each of the plurality of stage circuit units 1501 to 150*m* configured by the plurality of branch circuits BC is configured as one or more stages and a plurality of output buffer circuits (or buffers), one or more of the first to $x^{th}$ stage circuits SC1 to SCx may configure only one or more stages, and the other of the first to $x^{th}$ stage circuits SC1 to SCx may configure only a plurality of output buffer circuits (or buffers). For example, one or more of the first to $x^{th}$ stage circuits SC1 to SCx may configure a stage portion of the stage circuit unit, and the other of the first to $x^{th}$ stage circuits SC1 to SCx may configure a buffer portion of the stage circuit unit.

FIG. 7 is a diagram for describing a plurality of branch circuits and branch networks according to an embodiment of the present disclosure. FIG. 7 is a diagram illustrating a partial region of a display area including the branch circuit illustrated in FIG. 2.

Referring to FIG. 7, in a gate driving circuit 150 according to an embodiment of the present disclosure, a plurality of branch circuits BC may be disposed between emission parts EP of a plurality of pixels P in a first direction X.

One or more branch circuits BCi and BCj of the plurality of branch circuits BC1 to BCn may be electrically connected to the gate control line GCL, and the other branch circuits of the plurality of branch circuits BC1 to BCn may be connected to one another through the branch network BN and may supply or receive a signal.

Each of the plurality of branch circuits BC1 to BCn may include one or more thin film transistors (TFTs). For example, in the plurality of branch circuits BC1 to BCn, an i th branch circuit BCi may include one TFT, and a $j^{th}$ branch circuit BCj may include two TFTs.

According to an embodiment of the present disclosure, the TFT in the $i^{th}$ branch circuit BCi illustrated in FIG. 7 may be a pull-up TFT which output a scan signal to a gate line, but embodiments of the present disclosure are not limited thereto. For example, the pull-up TFT may include a gate electrode connected to a scan shift clock line of the gate control lines GCL and a second electrode connected to a network line which is connected to the gate line GL.

According to an embodiment of the present disclosure, the two TFTs in the $j^{th}$ branch circuit BCj illustrated in FIG. 7 may be configured to output a gate driving power based on a voltage of a first control node. For example, the two TFTs may be arranged in parallel with the gate control line GCL therebetween. For example, each of the two TFTs in the $j^{th}$ branch circuit BCj may include a gate electrode connected to the first control node, a first electrode connected to a network line which is connected to the gate driving power line, and a third electrode connected to another network line.

The branch network BN may be disposed above (or an upper side) or below (or a lower side) the emission part EP, in (or within) each horizontal line of a display area AA. For example, each horizontal line may include a middle region (or a horizontal middle region) MA including the emission part EP, an upper region (or a horizontal upper region) UA above the middle region MA, and a lower region (or a horizontal lower region) LA below the middle region MA.

The branch network BN according to an embodiment of the present disclosure may be disposed in (or at) the lower region LA of each of a plurality of horizontal lines. For example, the branch network BN may be disposed in (or at) a lower transmissive part TP of the emission part EP among transmissive parts TP of each of a plurality of pixels P arranged in each of a plurality of horizontal lines. For example, in FIGS. 3, 5, and 7, the branch network BN is illustrated as being disposed in (or at) a lower region LA of each of a plurality of horizontal lines, but embodiments of the present disclosure are not limited thereto and the branch network BN may be disposed in (or at) an upper region UA of each of the plurality of horizontal lines.

The branch network BN may include a plurality of control nodes CN and a plurality of network lines NL, or may include a plurality of circuit connection lines which are arranged at a certain interval in parallel. Each of the plurality of control nodes CN may be electrically connected to a gate electrode of a thin film transistor (TFT) configured in (or at) one or more of the plurality of branch circuits BC1 to BCn. For example, a first control node of the plurality of control nodes may be configured to charge a voltage supplied from the branch circuit in response to a gate start signal (or a set carry signal). One or more second control nodes of the plurality of control nodes may be configured to charge a voltage supplied from the branch circuit in response to the reset carry signal. For example, a voltage of the first control node and a voltage of the second control node may have voltage levels opposite to each other. For example, when the voltage of the first control node has a gate on voltage level, the voltage of the second control node may have a gate off voltage level.

Each of the plurality of network lines NL may be configured to connect a gate electrode, a first electrode, and a second electrode of a TFT, configured in (or at) the plurality of branch circuits BC1 to BCn, with each other. For example, the plurality of branch circuits BC1 to BCn may be organically connected to one another through a plurality of network lines. Therefore, each of the plurality of branch circuits BC1 to BCn may be organically connected to the gate control line GCL, the plurality of control nodes, and the plurality of network lines, and thus, may output the scan signal based on the scan shift clock and the gate start signal supplied through the gate control line GCL and a voltage of each of the plurality of control nodes.

One or more of the plurality of control nodes CN and the plurality of network lines NL may include a transparent conductive material capable of transmitting light. Each of the plurality of control nodes CN and the plurality of network lines NL may include a transparent conductive material capable of transmitting light. The transparent conductive material may include metal oxide such as indium gallium zinc oxide (IGZO) or the like. For example, the transparent conductive material may include amorphous metal oxide. Accordingly, each of the plurality of control nodes and the plurality of network lines may be configured as a transparent conductive material, and thus, a light transmission rate (or transmittance) of a transmissive part TP may be increased or enhanced by light passing through the branch network BN, thereby enhancing or increasing a total light transmission rate (or transmittance) of the display area AA.

The branch network BN and the plurality of network lines NL according to an embodiment of the present disclosure may include a plurality of first network lines NL1 and a plurality of second network lines NL2.

The plurality of first network lines NL1 may be configured to have a certain interval along a second direction Y and extend in a first direction X. For example, the plurality of first network lines NL1 may be arranged in parallel with the plurality of control nodes CN. For example, each of the plurality of first network lines NL1 may be a horizontal network line or a horizontal line pattern. Each of the plurality of first network lines NL1 may be configured as a transparent conductive material.

Each of the plurality of second network lines NL2 may be configured to include one or more of a first linear line parallel to the first direction X, a second linear line parallel to the second direction Y, a nonlinear line, and a curved line. Each of the plurality of second network lines NL2 may be configured to be electrically connected between the first network line NL1 and a TFT. For example, the first network line NL1 and the second network line NL2 may be configured in different layers. For example, the second network line NL2 may be electrically connected to one or more of the first network line NL1, an electrode of the TFT, and the gate control line GCL through a contact hole or a via hole.

The branch network BN according to an embodiment of the present disclosure, as illustrated in FIG. 12, may further include a plurality of carry signal lines CSL.

The plurality of carry signal lines CSL may be configured to transfer a carry signal between stage circuit units 1501 to 150*m* adjacent to one another along the second direction Y. For example, the plurality of carry signal lines CSL may be disposed between two pixels P adjacent to each other along the first direction X to have a certain interval along the second direction Y and may be electrically connected to one or more of the plurality of first network lines NL1.

The plurality of carry signal lines CSL may include a plurality of first carry signal lines and a plurality of second carry signal lines. For example, the plurality of carry signal lines CSL may be classified or grouped into the plurality of first carry signal lines and the plurality of second carry signal lines.

Each of the plurality of first carry signal lines may be disposed between two pixels P adjacent to each other along the first direction X to transfer a first carry signal between the stage circuit units 1501 to 150*m* adjacent to one another along the second direction Y. For example, the first carry signal may be a set signal, a set carry signal, or a previous carry signal. For example, the first carry signal line may be a set signal line, a set carry signal line, or a previous carry signal line.

Each of the plurality of second carry signal lines may be disposed between two pixels P adjacent to each other along the first direction X to transfer a second carry signal between the stage circuit units 1501 to 150*m* adjacent to one another along the second direction Y. For example, the second carry signal may be a reset signal, a reset carry signal, or a next carry signal. For example, the second carry signal line may be a reset signal line, a reset carry signal line, or a next carry signal line.

Figure 8:
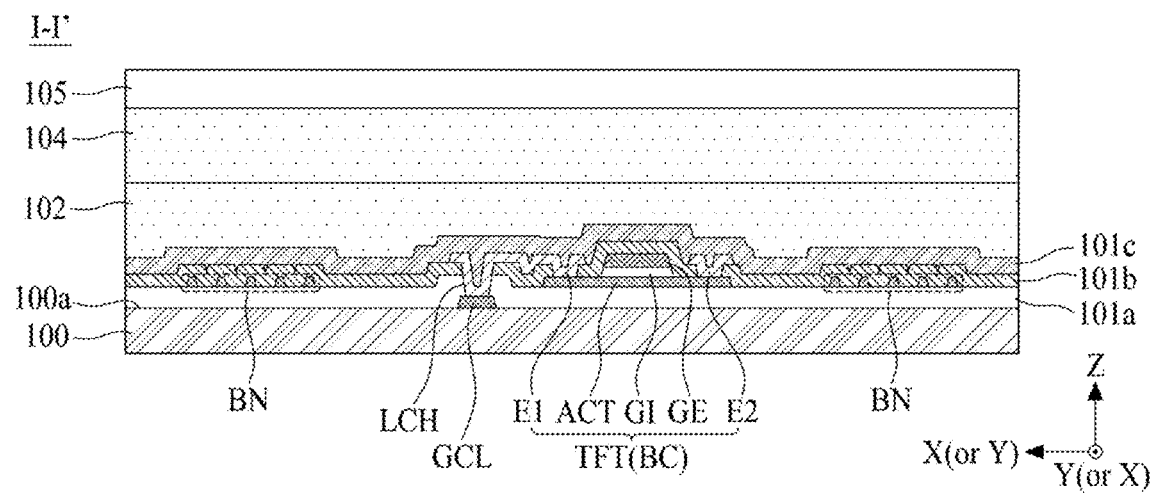
FIG. 8 is a cross-sectional view taken along line I-I' illustrated in FIG. 7.

FIG. 8 is a cross-sectional view taken along line I-I' illustrated in FIG. 7. FIG. 8 is a cross-sectional view illustrating a TFT and a branch network of the branch circuit illustrated in FIG. 7.

Referring to FIGS. 7 and 8, a branch circuit BCi according to an embodiment of the present disclosure may include a TFT connected to a branch network BN and a gate control line GCL.

The gate control line GCL may be disposed on a substrate 100 between two pixels P adjacent to each other along a first direction X and may be parallel to a second direction Y. For example, the gate control line GCL may be configured to directly contact an upper surface 100*a* of the substrate 100, but embodiments of the present disclosure are not limited thereto.

The gate control line GCL may be implemented by a patterning process of a light blocking layer (or a lower metal layer) disposed between the substrate 100 and a TFT of a pixel circuit configured in (or at) each of a plurality of pixels P. For example, the light blocking layer may be used as a signal line parallel to the first direction X among signal lines provided in (or at) the display area AA. For example, the gate control line GCL illustrated in FIG. 8 may be a scan shift clock line, but embodiments of the present disclosure are not limited thereto.

The gate control line GCL or the light blocking layer according to an embodiment of the present disclosure may be made of a single-layer structure or a multi-layer structure including at least one of molybdenum (Mo), titanium (Ti), a Mo—Ti alloy (MoTi), and copper (Cu), but embodiments of the present disclosure are not limited thereto. The gate control line GCL or the light blocking layer may be covered by a buffer layer 101*a*.

A TFT of a branch circuit BC according to an embodiment of the present disclosure may be configured on the buffer layer 101*a* adjacent to the gate control line GCL. The TFT of the branch circuit BC may be formed together with the TFT of the pixel circuit configured at (or in) each of the plurality of pixels P. For example, the TFT of the branch circuit BC may include an active layer ACT, a gate insulation layer GI, a gate electrode GE, an interlayer insulation layer 101*b*, a first electrode E1, and a second electrode E2.

The active layer ACT may be disposed on the buffer layer 101*a* of a branch circuit region. The active layer ACT may include a source area and a drain area, and a channel area between the source area and the drain area. For example, the active layer ACT may have conductivity in a conductivity process, and thus, may be used as a bridge line of a jumping structure which directly connects signal lines in (within) the display area AA or electrically connects lines disposed on (or at) different layers.

The gate insulation layer GI may be disposed on the channel area of the active layer ACT. The gate insulation layer GI may insulate the active layer ACT from the gate electrode GE.

The gate electrode GE may be disposed on the gate insulation layer GI. The gate electrode GE may overlap the channel area of the active layer ACT with the gate insulation layer GI therebetween. The gate electrode GE according to an embodiment of the present disclosure may be made of a single-layer structure or a multi-layer structure including at least one of molybdenum (Mo), titanium (Ti), a Mo—Ti alloy (MoTi), and copper (Cu), but embodiments of the present disclosure are not limited thereto.

The interlayer insulation layer 101*b* may be disposed on the substrate 100 to cover the gate electrode GE and the active layer ACT of the TFT. The interlayer insulation layer 101*b* may electrically insulate (or isolate) the gate electrode GE.

The first electrode E1 may be disposed on the interlayer insulation layer 101*b* overlapping the source area (or the drain area) of the active layer ACT and may be electrically connected to the source area (or the drain area) of the active layer ACT through a first contact hole disposed at (or in) the interlayer insulation layer 101*b*.

The second electrode E2 may be disposed on the interlayer insulation layer 101*b* overlapping the drain area (or the source area) of the active layer ACT and may be electrically connected to the drain area (or the source area) of the active layer ACT through a second contact hole which is disposed at the interlayer insulation layer 101*b*.

The first electrode E1 and the second electrode E2 according to an embodiment of the present disclosure may have a single-layer structure or a multi-layer structure made of the same material as that of the gate electrode GE.

According to an embodiment of the present disclosure, in the TFT of the branch circuit BC, each of the gate electrode GE, the first electrode E1, and the second electrode E2 may be selectively connected to the gate control line GCL and the branch network BN. For example, in the branch circuit BCi illustrated in FIGS. 7 and 8, the gate electrode GE may be connected to the first control node. The first electrode E1 may be electrically connected to the gate control line GCL through a line contact hole LCH provided at the buffer layer 101*a* and the interlayer insulation layer 101*b*. The second electrode E2 may be connected to any one line of a plurality of network lines.

The TFT of the branch circuit BC may be covered by the passivation layer 101*c*. For example, the passivation layer 101*c* may be formed of an inorganic material. For example, the passivation layer 101*c* may be omitted.

The branch circuit BC or the passivation layer 101*c* may be covered by a first overcoat layer (or a first planarization layer) 102. The first overcoat layer 102 may planarize an upper portion (or an upper surface) of a passivation layer 101*c* and may protect the TFT. For example, the first overcoat layer 102 may be formed to have a thickness which is relatively thicker, and thus, may provide a flat surface on the upper portion (or the upper surface) of a passivation layer 101*c*.

The first overcoat layer 102 may be covered by a second overcoat layer (or a second planarization layer) 104. The second overcoat layer 104 may provide a flat surface on the upper portion (or the upper surface) of the first overcoat layer 102. For example, the second overcoat layer 104 may be formed of the same material as the first overcoat layer 102 and may have the same thickness as or a different thickness than the first overcoat layer 102.

The second overcoat layer 104 disposed between emission parts EP of each of a plurality of pixels P may be covered by a bank layer 105. The bank layer 105 may be disposed in (or at) the other region, except the emission part EP of each of the plurality of pixels P, of the display area AA. For example, the bank layer 105 may include a plurality of opening patterns corresponding to a center portion of a pixel electrode disposed in (or at) the emission part EP of each of the plurality of pixels P. The bank layer 105 may be made of a transparent inorganic material or a transparent organic material.

According to an embodiment of the present disclosure, a light emitting device and a common electrode may be sequentially arranged on the bank layer 105, an encapsulation layer including a plurality of inorganic encapsulation layers and one or more organic encapsulation layers may be disposed on the common electrode, and a color filter may be disposed on the encapsulation layer overlapping each of the plurality of opening patterns of the bank layer 105 or the emission part EP of each of the plurality of pixels P.

The branch network BN may be disposed on a buffer layer 101a of a transmissive part TP. The branch network BN may be directly covered or surrounded by an interlayer insulation layer 101b, but embodiments of the present disclosure are not limited thereto. For example, the branch network BN may be directly covered by one of a gate insulation layer GI, an interlayer insulation layer 101b, a passivation layer 101c, a first overcoat layer 102, a second overcoat layer 104, and a bank layer 105.

The branch network BN according to an embodiment of the present disclosure may be formed of the same material in the same process as an active layer of a TFT configured in (or at) a display area AA. For example, each of a plurality of control nodes CN and a plurality of network lines NL configuring the branch network BN may include the same material as that of the active layer of the TFT provided in (or at) the display area AA. For example, a material the active layer of the TFT configuring each of the plurality of control nodes CN and the plurality of network lines NL may have conductivity together with a source region/drain region of the active layer of the TFT by using a conductivity-enabling process, and thus, each of the plurality of control nodes CN and the plurality of network lines NL may be implemented as a transparent line for signal transfer. Accordingly, each of the plurality of control nodes CN and the plurality of network lines NL may be configured as the active layer of the TFT (or a transparent conductive material), and thus, a light transmission rate (or transmittance) of a transmissive part TP may be increased or enhanced by light passing through the branch network BN, thereby enhancing or increasing a total light transmission rate (or transmittance) of the display area AA.

Figure 9:
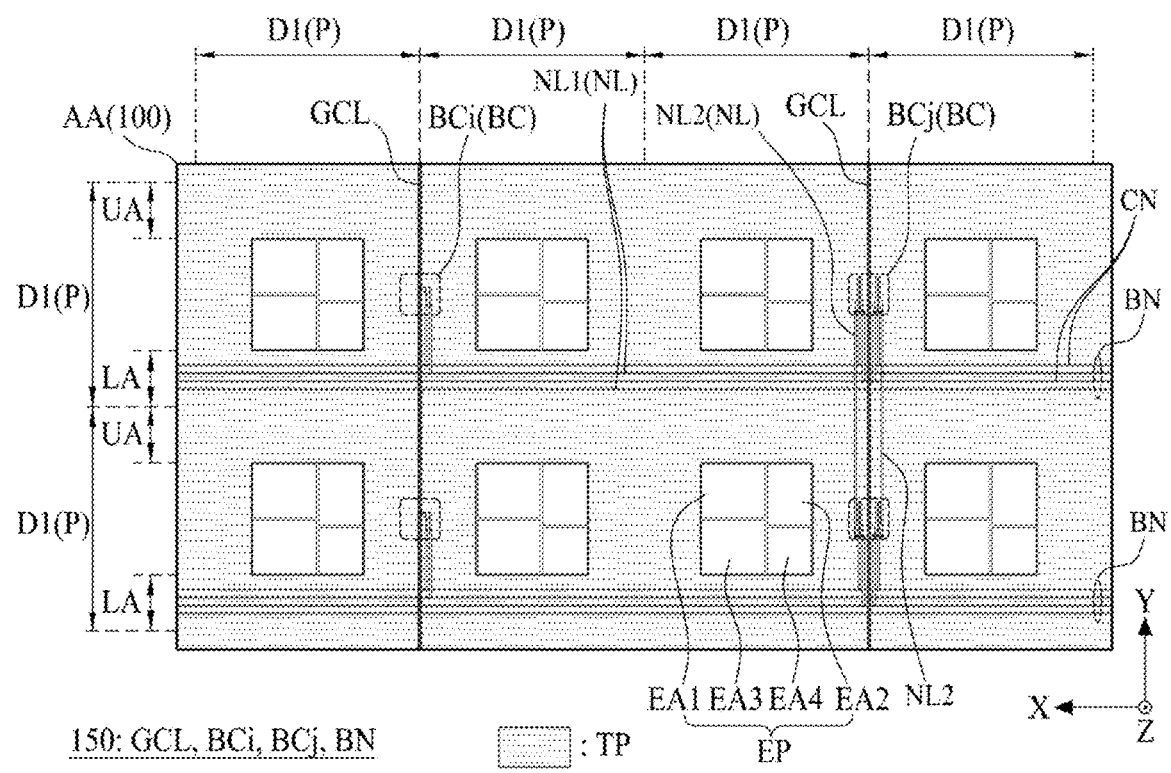
FIG. 9 is a diagram for describing a plurality of branch circuits and branch networks according to an embodiment of the present disclosure.

FIG. 9 is a diagram for describing a plurality of branch circuits and branch networks according to an embodiment of the present disclosure. FIG. 9 illustrates an embodiment which is configured so that some of the plurality of branch networks illustrated in FIG. 7 are shared by a plurality of branch circuits arranged in an adjacent horizontal line. In the following description, therefore, repeated descriptions of the other elements except a sharing structure between a plurality of branch circuits and branch networks and relevant elements are omitted.

Referring to FIG. 9, in a gate driving circuit 150 according to an embodiment of the present disclosure, a branch network BN disposed in (or at) each of a plurality of horizontal lines may include a plurality of circuit connection lines CN and NL, and some of the plurality of circuit connection lines CN and NL provided in (or at) each of the plurality of horizontal lines may share a plurality of branch circuits BC arranged in (or at) horizontal lines vertically adjacent to one another along a second direction Y. For example, a plurality of control nodes CN and a plurality of network lines NL may be provided, and some of the plurality of network lines NL provided in (or at) each of the plurality of horizontal lines may be shared by the plurality of branch circuits BC arranged in (or at) horizontal lines vertically adjacent to one another along the second direction Y.

According to an embodiment of the present disclosure, a plurality of branch circuits BC disposed in (or at) a $2k-1^{th}$ horizontal line may be configured to be connected to a plurality of control nodes CN disposed in (or at) the $2k-1^{th}$ horizontal line, and a plurality of branch circuits BC disposed in (or at) a $2k^{th}$ horizontal line may be configured to be connected to a plurality of control nodes CN disposed in (or at) the $2k^{th}$ horizontal line. Some of the plurality of branch circuits BC disposed in (or at) the $2k-1^{th}$ horizontal line and some of the plurality of branch circuits BC disposed in (or at) the $2k^{th}$ horizontal line may be configured to be connected to some of a plurality of network lines NL disposed in (or at) the $2k-1^{th}$ horizontal line and some of a plurality of network lines NL disposed in (or at) the $2k^{th}$ horizontal line. For example, some of the plurality of network lines NL provided in (or at) each of the plurality of horizontal lines may be shared by some of the plurality of branch circuits BC disposed in (or at) the $2k-1^{th}$ horizontal line and some of the plurality of branch circuits BC disposed in (or at) the $2k^{th}$ horizontal line.

According to an embodiment of the present disclosure, a first electrode of a TFT provided in a $j^{th}$ branch circuit BCj of the plurality of branch circuits BC disposed in (or at) the $2k^{th}$ horizontal line may be configured to be connected to some of the plurality of network lines NL disposed in (or at) the $2k-1^{th}$ horizontal line. For example, some of the plurality of network lines NL disposed in (or at) the $2k-1^{th}$ horizontal line may be connected to or shared by, in common, a first electrode of a TFT provided in (or at) a $j^{th}$ branch circuit BCj disposed in (or at) the $2k-1^{th}$ horizontal line and a first electrode of a TFT provided in (or at) the $j^{th}$ branch circuit BCj disposed in (or at) the $2k^{th}$ horizontal line. For example, a network line connected to a gate driving power line among a plurality of first network lines NL1 disposed in (or at) the $2k-1^{th}$ horizontal line may be connected to or shared by, in common, the first electrode of the TFT provided in (or at) the $j^{th}$ branch circuit BCj disposed in (or at) each of the $2k-1^{th}$ horizontal line and the $2k^{th}$ horizontal line. For example, a second network line NL2 disposed in (or at) the $2k^{th}$ horizontal line may be configured to be electrically connected between the first electrode of the TFT, provided in (or at) the $j^{th}$ branch circuit BCj disposed in (or at) the $2k^{th}$ horizontal line, and a network line disposed in (or at) the $2k-1^{th}$ horizontal line.

According to an embodiment of the present disclosure, the number of network lines NL disposed in (or at) each of the plurality of horizontal lines may decrease by the number of network lines NL shared by a plurality of branch circuits BC disposed in (or at) horizontal lines vertically adjacent to one another, and thus, a disposition region of the branch network BN in the transmissive part TP of each of the plurality of horizontal lines may be reduced, thereby enhancing or increasing a total light transmission rate (or transmittance) of the display area AA.

Figure 10:
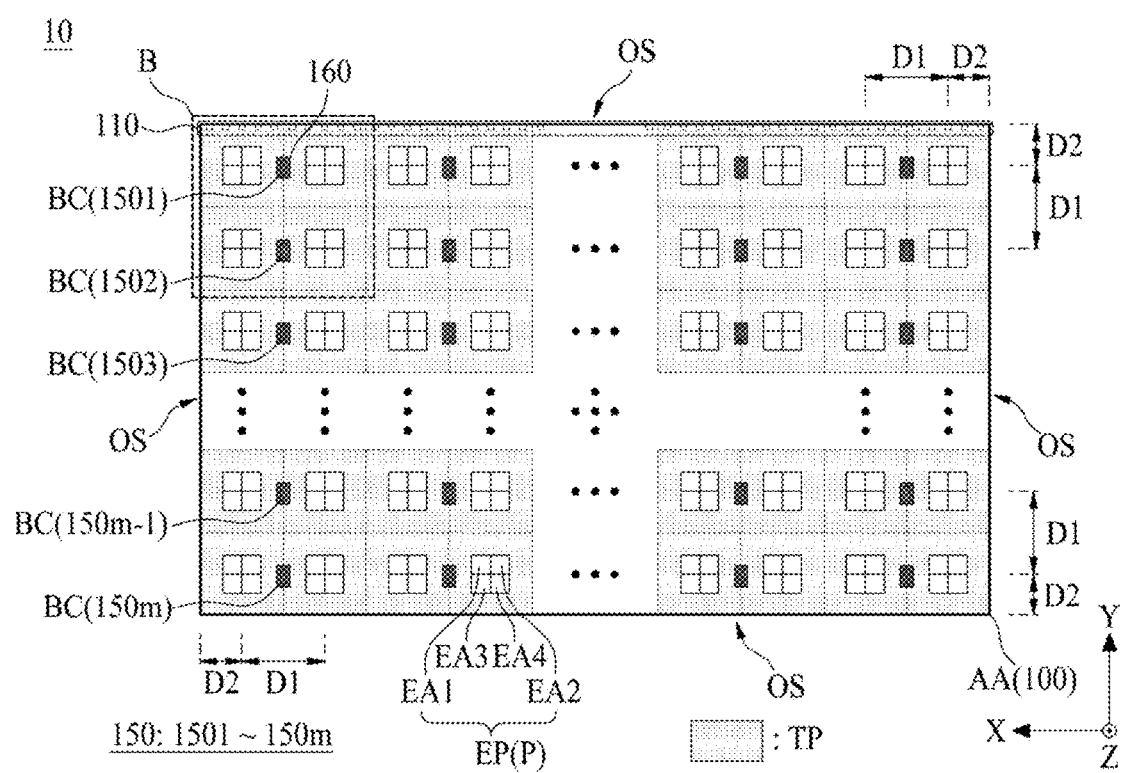
FIG. 10 is a diagram illustrating a display panel of a display apparatus according to an embodiment of the present disclosure.
Figure 11:
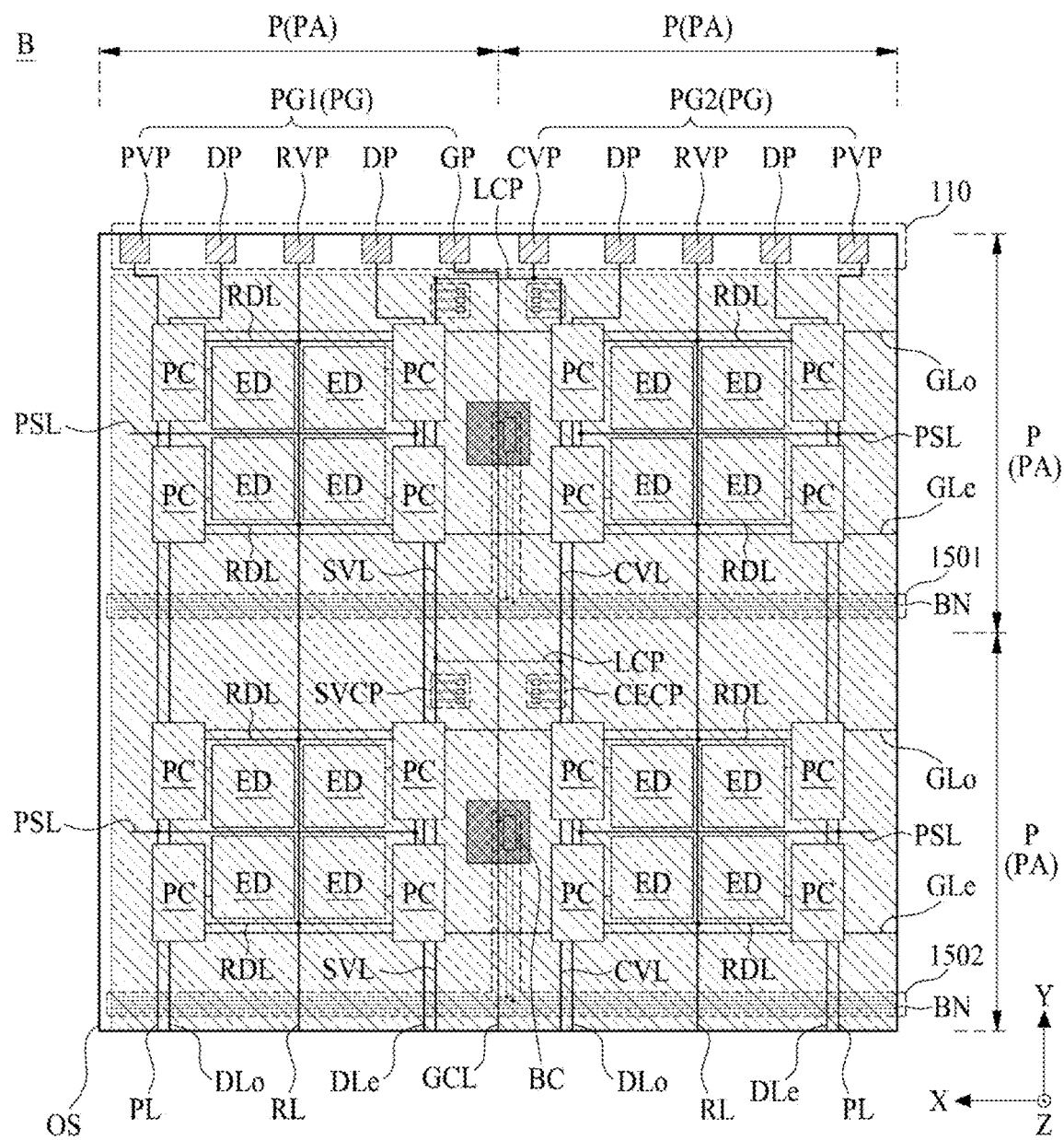
FIG. 11 is an enlarged view of a region 13' illustrated in FIG. 10.

FIG. 10 is a diagram illustrating a display panel of a display apparatus according to an embodiment of the present disclosure. FIG. 11 is an enlarged view of a region 'B' illustrated in FIG. 10. FIGS. 10 and 11 illustrate an embodiment where a plurality of dummy patterns are additionally provided in the display apparatus illustrated in FIGS. 1 to 9. In the following description, therefore, repeated descriptions of the other elements except a plurality of dummy patterns and relevant elements are omitted or may be briefly provided.

Referring to FIGS. 10 and 11, a display apparatus (or a display panel 10 or a display area AA) according to an embodiment of the present disclosure may further include a plurality of dummy patterns 160. For example, the dummy pattern 160 may be a metal pattern, an auxiliary pattern, an additional pattern, a cover pattern, a pattern member, or an island pattern.

The plurality of dummy patterns 160 may be disposed on the substrate 100 to overlap a peripheral circuit (or an embedded peripheral circuit) disposed between the emission parts EP of each of the plurality of pixels P. For example, the plurality of dummy patterns 160 may be disposed to cover the peripheral circuit (or the embedded peripheral circuit) disposed between the emission parts EP of each of the plurality of pixels P. Therefore, each of the plurality of dummy patterns 160 may be configured to reduce, minimize or prevent a size (or transmittance or transparency) deviation between the transmissive parts TP caused by the peripheral circuit or the like, and thus, may reduce, minimize or prevent a dim phenomenon such as stripe smears or the like occurring due to the size (or transmittance or transparency) deviation between the transmissive parts TP, thereby enhancing a transmittance or transparency of the display apparatus (or the transparent display apparatus) according to an embodiment of the present disclosure.

Each of the plurality of dummy patterns 160 according to an embodiment of the present disclosure may be disposed on the substrate 100 to overlap the gate driving circuit 150. For example, each of the plurality of dummy patterns 160 may be disposed on the substrate 100 to overlap each of the plurality of branch circuits BC disposed in the gate driving circuit 150. For example, each of the plurality of dummy patterns 160 may be disposed to cover each of the plurality of branch circuits BC disposed in (or at) the gate driving circuit 150. Therefore, each of the plurality of dummy patterns 160 may be configured to reduce, minimize or prevent a size (or transmittance or transparency) deviation between the transmissive parts TP caused by the branch circuit BC or the like, and thus, may reduce, minimize or prevent a dim phenomenon such as stripe smears or the like occurring due to the size (or transmittance or transparency) deviation between the transmissive parts TP, thereby enhancing a transmittance or transparency of the display apparatus (or the transparent display apparatus) according to an embodiment of the present disclosure.

Each of the plurality of dummy patterns 160 may be configured to have the same shape and the same size within an error range of a manufacturing process, so as to reduce, minimize or prevent the size (or transmittance or transparency) deviation between the transmissive parts TP. For example, each of the plurality of dummy patterns 160 may be configured to have a size (or an area) which is greater than that of a corresponding peripheral circuit (or imbedded peripheral circuit) or a corresponding branch circuit BC, and thus, may completely cover the corresponding peripheral circuit (or imbedded peripheral circuit) or the corresponding branch circuit BC.

Each of the plurality of dummy patterns 160 according to an embodiment of the present disclosure may be configured as an opaque metal material, but embodiments of the present disclosure are not limited thereto and each of the plurality of dummy patterns 160 may be configured as a semitransparent metal material.

FIG. 12 is a diagram for describing a plurality of dummy patterns according to an embodiment of the present disclosure. FIG. 12 is a diagram illustrating a partial region of the display area including dummy patterns illustrated in FIG. 10.

Referring to FIG. 12, each of a plurality of dummy patterns 160 according to an embodiment of the present disclosure may be disposed on a substrate 100 to overlap a gate driving circuit 150. For example, each of a plurality of dummy patterns 160 may be disposed in (or at) a display area AA to respectively overlap a plurality of branch circuits BC disposed in (or at) the gate driving circuit 150.

According to an embodiment of the present disclosure, each of the plurality of dummy patterns 160 may be disposed to respectively cover the plurality of branch circuits BC disposed in (or at) the gate driving circuit 150. Each of the plurality of dummy patterns 160 may be configured to have the same shape and the same size. Each of the plurality of dummy patterns 160 may be configured to be disposed at (or in) the same position between two pixels P adjacent to each other along a first direction X. For example, with respect to the first direction X, the plurality of dummy patterns 160 may be positioned or aligned on (or at) the same line. For example, a center portion (or a middle portion) of each of the plurality of dummy patterns 160 may be positioned or aligned on (or at) a virtual horizontal line parallel to the first direction X.

According to an embodiment of the present disclosure, one or more first dummy patterns 161 of the plurality of dummy patterns 160 may be disposed to cover an $i^{th}$ branch circuit BCi including one TFT among the plurality of branch circuits BC. For example, one or more second dummy patterns 162 of the plurality of dummy patterns 160 may be disposed to cover a $j^{th}$ branch circuit BCj including two or more TFTs among the plurality of branch circuits BC. The one or more first dummy patterns 161 and the one or more second dummy patterns 162 may be configured to have the same shape and the same size. For example, the one or more first dummy patterns 161 and the one or more second dummy patterns 162 may be configured to have a size (or an area) which is relatively greater than that of each of corresponding branch circuits BCi and BCj, and thus, may completely cover the corresponding branch circuits BCi and BCj. Accordingly, each of the plurality of dummy patterns 160 may reduce, minimize or prevent a dim phenomenon such as stripe smears or the like occurring due to a size (or transmittance or transparency) deviation between transmissive parts TP caused by a size (or area) deviation between the corresponding branch circuits BCi and BCj.

According to an embodiment of the present disclosure, each of the plurality of dummy patterns 160 may be disposed to additionally cover a carry signal line CSL disposed along the second direction Y among the branch networks BN disposed in (or at) the gate driving circuit 150. For example, one or more third dummy patterns 163 of the plurality of dummy patterns 160 may be disposed to cover one or more carry signal lines CSL disposed between two pixels P adjacent to each other along the first direction X.

The one or more third dummy patterns 163 may be configured to have the same shape and the same size as those of each of one or more first dummy patterns 161 and one or more second dummy patterns 162. For example, each of the one or more first dummy patterns 161, the one or more second dummy patterns 162, and the one or more third dummy patterns 163 may be positioned or aligned on (or at) the same line, with respect to the first direction X. For example, in a region between emission parts EP of the pixels P, a size (or transmittance or transparency) of a transmissive part TP (or a first region) where the branch circuits BCi and BCj are disposed may differ from a size (or transmittance or transparency) of a transmissive part TP (or a second region) where one or more carry signal lines CSL are provided without the branch circuits BCi and BCj, and thus, the one or more third dummy patterns 163 may be disposed to cover the one or more carry signal lines CSL, thereby more reducing, minimizing or preventing a dim phenomenon such as stripe smears or the like occurring due to a size (or transmittance or transparency) deviation between transmissive parts TP caused by a size (or area) deviation between the branch circuits BCi and BCj and the one or more carry signal lines CSL.

Each of the plurality of dummy patterns 160 according to an embodiment of the present disclosure may be configured to include a material for collecting hydrogen or capable of trapping hydrogen atoms. That is, the plurality of dummy patterns 160 may be formed of a material capable of collecting hydrogen (i.e., hydrogen collecting material). For example, each of the plurality of dummy patterns 160 may include a metal material including titanium (Ti). For example, each of the plurality of dummy patterns 160 may include a metal material including Ti or a molybdenum-titanium alloy (MoTi). For example, each of the plurality of dummy patterns 160 may be a single layer of titanium, a double layer of molybdenum (Mo) and titanium (Ti), or an alloy of molybdenum (Mo) and titanium (Ti). Accordingly, each of the plurality of dummy patterns 160 may collect or block hydrogen diffused from a hydrogen-containing material formed or disposed at a periphery thereof, and thus, may reduce, minimize or prevent a change, caused by hydrogen, in electrical characteristic of a TFT of the pixel P and/or a TFT of the gate driving circuit 150 disposed in (or at) the display area AA.

Figure 13:
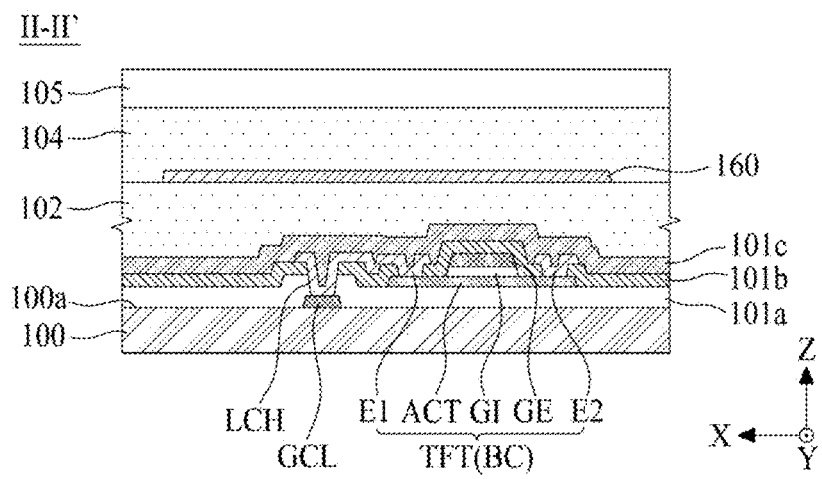
FIG. 13 is a cross-sectional view taken along line II-II' illustrated in FIG. 12.

FIG. 13 is a cross-sectional view taken along line II-II' illustrated in FIG. 12. FIG. 13 is a cross-sectional view illustrating the gate control line, the TFT of the branch circuit, and the dummy pattern illustrated in FIG. 12.

Referring to FIGS. 12 and 13, according to an embodiment of the present disclosure, each of the gate control line GCL and the TFT of the branch circuit may be substantially the same as the gate control line GCL and the $i^{th}$ branch circuit BC described with reference to FIGS. 7 and 8, and thus, repeated descriptions thereof are omitted.

The dummy pattern 160 according to an embodiment of the present disclosure may be disposed on the first overcoat layer 102 to overlap the branch circuit BC or cover the branch circuit BC.

According to an embodiment of the present disclosure, the dummy pattern 160 may be disposed on the first overcoat layer 102 to cover the branch circuit BC. For example, the dummy pattern 160 may be disposed on the first overcoat layer 102 to cover the TFT of the branch circuit BC. For example, the dummy pattern 160 may be configured to block light incident on the TFT of the branch circuit BC from the outside.

According to an embodiment of the present disclosure, the dummy pattern 160 may have a size which is greater than that of the branch circuit BC. For example, the dummy pattern 160 may have a size which is greater than that of the TFT of the branch circuit BC. For example, the dummy pattern 160 may have a size, which is greater than that of the TFT of the branch circuit BC, within a range for minimizing a reduction in size (or area) of a transmissive part TP provided between two adjacent pixels P where the branch circuit BC is disposed.

According to an embodiment of the present disclosure, the dummy pattern 160 may have a shape and a size which completely cover the branch circuit BC or completely covers the TFT of the branch circuit BC. For example, the dummy pattern 160 may have a square shape or a circular shape, but the present disclosure is not limited thereto, and other various shapes are also possible. Each of a plurality of dummy patterns 160 according to an embodiment of the present disclosure may be implemented in an island shape in (or within) the display area AA, and thus, may be electrically floated. Accordingly, an electric potential of each of the plurality of dummy patterns 160 may vary based on a change in signal applied to the branch circuit BC, and a malfunction of the branch circuit BC or the TFT of the branch circuit BC may occur due to a change in electric potential of each of the plurality of dummy patterns 160. To reduce, minimize or prevent a malfunction of the branch circuit BC caused by a change in electric potential of each of the plurality of dummy patterns 160, the first overcoat layer 102 between the dummy pattern 160 and the branch circuit BC may be formed to have a sufficient large thickness.

The dummy pattern 160 may be covered by a second overcoat layer (or a second planarization layer) 104. The second overcoat layer 104 may be disposed on the first overcoat layer 102 to cover or surround the dummy pattern 160 and may provide a flat surface on an upper portion (or an upper surface) of the first overcoat layer 102 and the dummy pattern 160. For example, the second overcoat layer 104 may include the same material as that of the first overcoat layer 102 and may be formed to have a thickness which is equal to or different from that of the first overcoat layer 102.

As described above, the dummy pattern 160 may reduce, minimize or prevent a size (or transmittance or transparency) deviation between transmissive parts TP caused by a size (or area) deviation between the branch circuits BC, and thus, a light transmission rate or a transmittance of the display apparatus (or the transparent display apparatus) according to an embodiment of the present disclosure may be enhanced.

The dummy pattern 160 according to an embodiment of the present disclosure may be configured to include a material for collecting hydrogen. For example, the dummy pattern 160 may include a metal material including titanium (Ti). For example, the dummy pattern 160 may include a metal material including Ti or a molybdenum-titanium alloy (MoTi). Accordingly, the dummy pattern 160 may collect or block hydrogen generated in one or more of buffer layer 101a, the interlayer insulation layer 101b, the passivation layer 101c, the first overcoat layer 102, the second overcoat layer 104, the bank layer 105, and the encapsulation layer, which are disposed in (or at) the display area AA, and thus, may reduce, minimize or prevent a change, caused by hydrogen, in electrical characteristic of a TFT of the pixel P and/or a TFT of the gate driving circuit 150.

Figure 14:
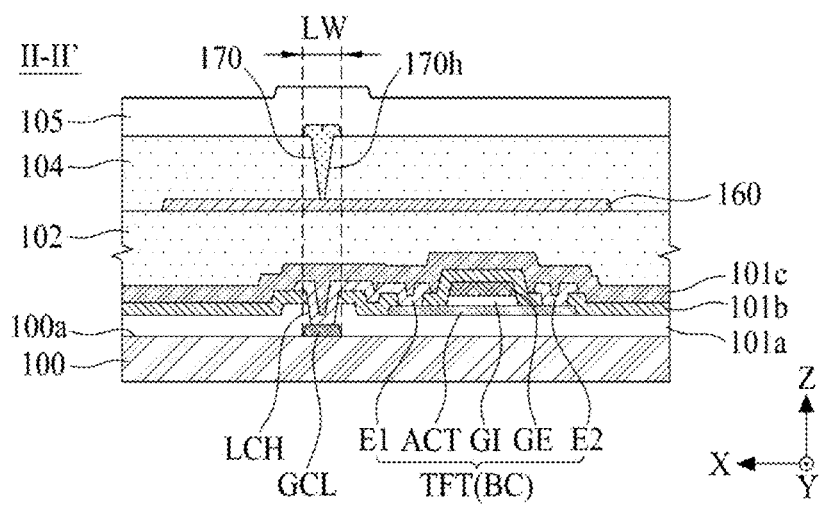
FIG. 14 is another cross-sectional view taken along line II-IF illustrated in FIG. 12.

FIG. 14 is another cross-sectional view taken along line II-IF illustrated in FIG. 12. FIG. 14 illustrates an embodiment where a dummy line is additionally provided in the display apparatus illustrated in FIGS. 10, 11, and 12. In the following description, therefore, repeated descriptions of the other elements except a plurality of dummy lines and relevant elements are omitted or may be briefly provided.

Referring to FIGS. 10, 11, 12, and 14, in a display apparatus according to an embodiment of the present disclosure, each of a plurality of dummy lines 170 may extend long in parallel with a second direction Y and may be electrically connected to a corresponding dummy pattern of a plurality of dummy patterns 160, disposed in (or at) a display area AA, along the second direction Y. For example, the dummy line 170 may be a pattern connection line, a pattern connection member, a pattern bridge line, or a pattern link line.

Each of the plurality of dummy lines 170 may be disposed on the second overcoat layer 104 to overlap each of the plurality of dummy patterns 160 along the second direction Y and may be electrically connected to a corresponding dummy pattern of the plurality of dummy patterns 160 through a contact hole 170h provided in (or at) the second overcoat layer 104 overlapping each of the plurality of dummy patterns 160.

Each of the plurality of dummy lines 170 may be formed together with a pixel electrode PE disposed on the second overcoat layer 104 in (or at) the emission part EP of each of the plurality of pixels P. For example, each of the plurality of dummy lines 170 may be formed of the same material in the same process as the pixel electrode PE, but embodiments of the present disclosure are not limited thereto In a case where each of the plurality of dummy lines 170 is formed together with the pixel electrode PE used as a reflection electrode of the pixel P, each of the plurality of dummy lines 170 may decrease a size (or transmittance or transparency) of the transmissive part TP. For example, in a case where the dummy line 170 and the gate control line GCL are arranged spaced apart from each other in parallel without overlapping each other, a size (or transmittance or transparency) of the transmissive part TP may decrease by a size (or an area) of the dummy line 170 spaced apart from the gate control line GCL. To minimize a reduction in size (or transmittance or transparency) of the transmissive part TP, each of the plurality of dummy lines 170 may be disposed on the substrate 100 to overlap the gate control line GCL. For example, each of the plurality of dummy lines 170 may have a line width LW which is equal to that of the gate control line GCL. For example, with respect to the first direction X, a width of an overlap region between the dummy line 170 and the gate control line GCL may be the same as a line width LW of the dummy line 170 or the gate control line GCL.

Each of the plurality of dummy lines 170 may be configured to maintain a certain electric potential of each of the plurality of dummy patterns 160 in an electrically floated state. For example, each of the plurality of dummy lines 170 may supply a direct current (DC) voltage to each of the plurality of dummy patterns 160. For example, each of the plurality of dummy lines 170 may be configured to supply a pixel common voltage, supplied from the pad part 110, to each of the plurality of dummy patterns 160.

Each of the plurality of dummy lines 170 according to an embodiment of the present disclosure may be configured to be electrically connected to a pixel common voltage pad CVP in (or at) the pad part 110. For example, each of the plurality of dummy lines 170 may be configured to be electrically connected to one or more of a pixel common voltage line CVL, an auxiliary voltage line SVL, and a line connection pattern LCP which are electrically connected to the pixel common voltage pad CVP. For example, each of the plurality of dummy lines 170 may be disposed to intersect with one or more of a plurality of line connection patterns LCP and may be electrically connected to the line connection pattern LCP through a contact hole provided in (or at) an intersection portion corresponding to one or more line connection patterns LCP.

Additionally, a middle metal pattern may be additionally disposed between each of the plurality of dummy lines 170 and the line connection pattern LCP. The middle metal pattern may be configured to reduce a height difference (or a step height) between the dummy line 170 and the line connection pattern LCP. Therefore, each of the plurality of dummy lines 170 may be stably connected to the line connection pattern LCP through the middle metal pattern. Accordingly, each of the plurality of dummy lines 170 may supply a pixel common voltage, supplied through the pixel common voltage pad CVP and the pixel common voltage line CVL, to a corresponding dummy pattern of the plurality of dummy patterns 160.

According to an embodiment of the present disclosure, each of the plurality of dummy patterns 160 may be electrically connected to the dummy line 170, and thus, may not affect a variation of a signal applied to the branch circuit BC or the gate control line GCL and may be fixed to or maintained with a certain electric potential or an electric potential of the pixel common voltage. Accordingly, each of the plurality of dummy patterns 160 may reduce, minimize or prevent a size (or transmittance or transparency) deviation between transmissive parts TP caused by a size (or area) deviation between the branch circuits BC without causing a malfunction of the branch circuit BC or the TFT of the branch circuit BC, and thus, a light transmission rate or a transmittance of the display apparatus (or the transparent display apparatus) according to an embodiment of the present disclosure may be enhanced.

Figure 15:
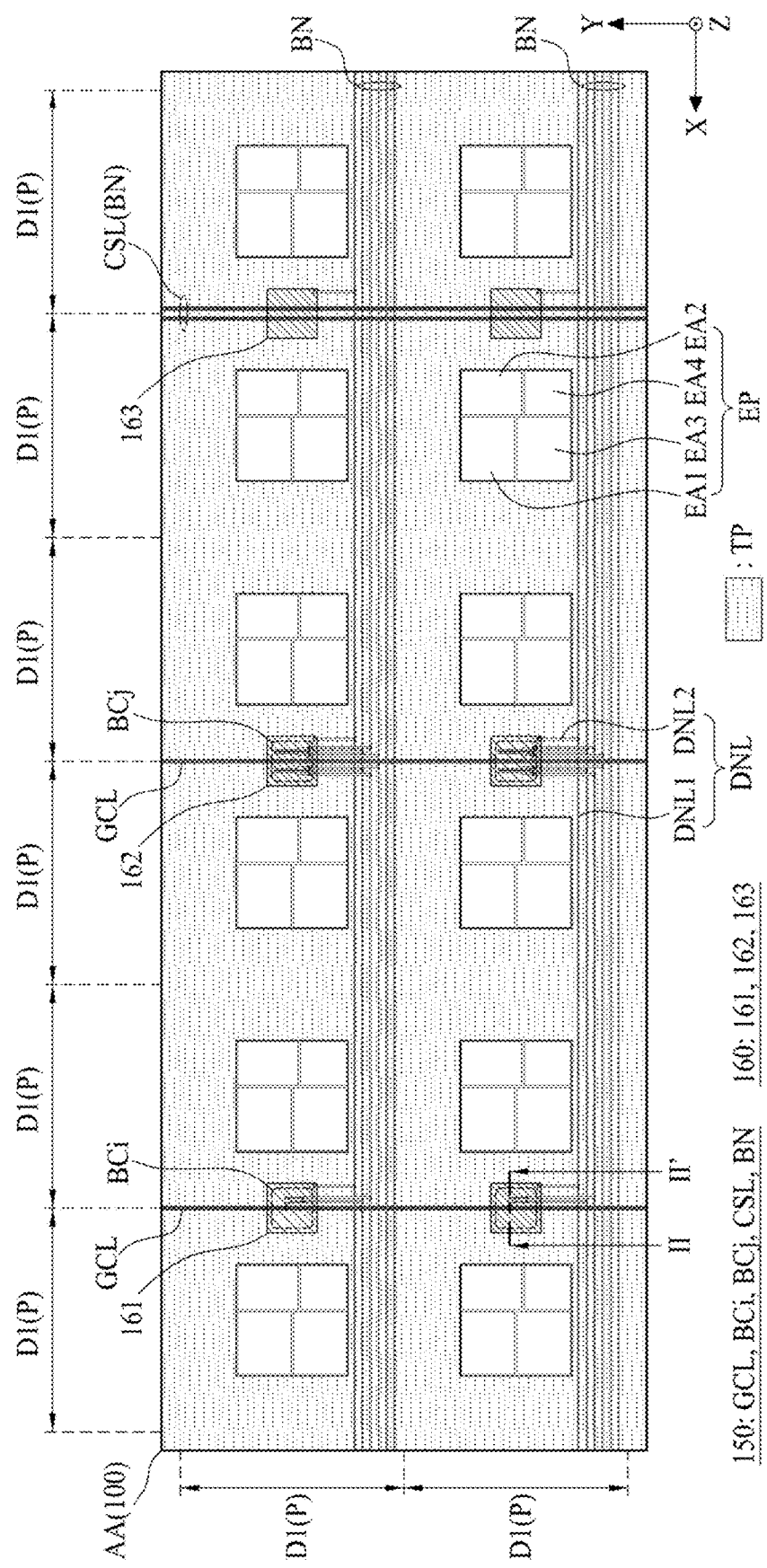
FIG. 15 is a diagram for describing a dummy network line according to an embodiment of the present disclosure.
Figure 16:
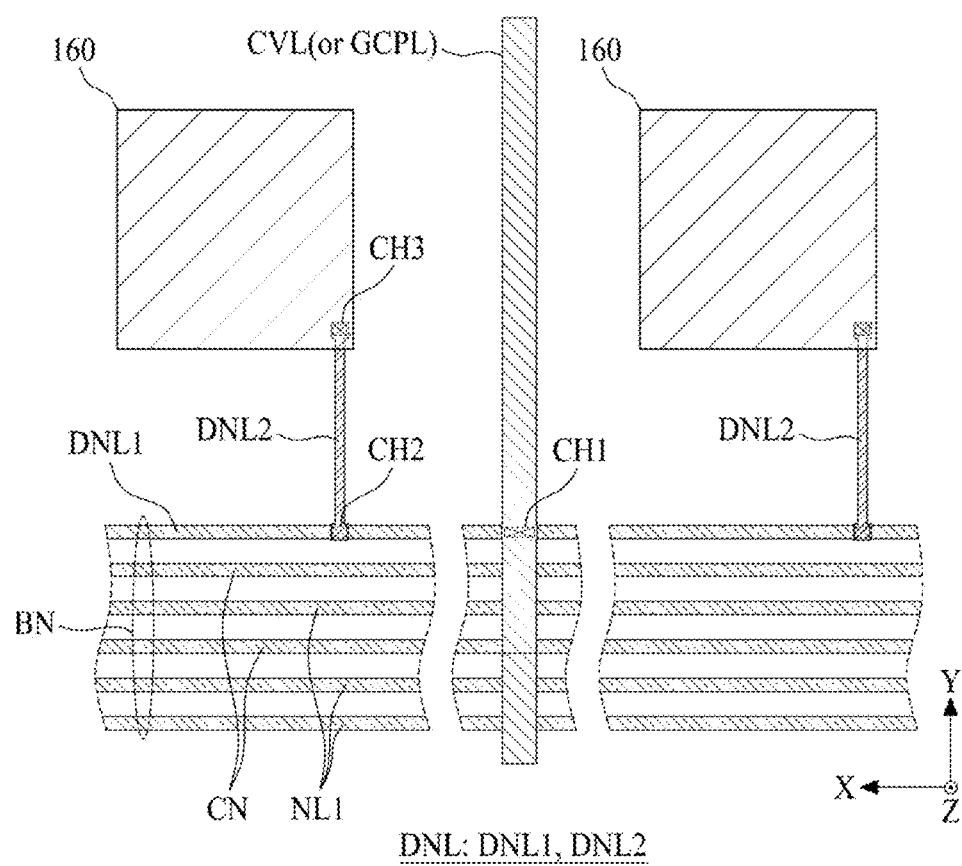
FIG. 16 is a diagram schematically illustrating a connection structure between a dummy pattern and the dummy network line illustrated in FIG. 15.

FIG. 15 is a diagram for describing a dummy network line according to an embodiment of the present disclosure. FIG. 16 is a diagram schematically illustrating a connection structure between a dummy pattern and the dummy network line illustrated in FIG. 15. FIGS. 15 and 16 illustrate an embodiment where the dummy network line connected to the dummy pattern illustrated in FIG. 12 is additionally provided. In the following description, therefore, repeated descriptions of the other elements except a connection structure between a dummy pattern and a dummy network line and relevant elements are omitted or may be briefly provided.

Referring to FIGS. 11, 15, and 16, in a display apparatus according to an embodiment of the present disclosure, a branch network BN which is disposed in (or at) each of a plurality of horizontal lines in (or at) a display area AA may include a dummy network line DNL.

The dummy network line DNL may include a first dummy network line DNL1 and a second dummy network line DNL2.

The first dummy network line DNL1 may extend long in parallel with a first direction X and may be configured in parallel with a plurality of control nodes CN. For example, the first dummy network line DNL1 may be disposed between an emission part EP and a control node CN in (or at) each horizontal line, but embodiments of the present disclosure are not limited thereto. For example, the first dummy network line DNL1 may be formed of the same material in the same process as the plurality of control nodes CN, but embodiments of the present disclosure are not limited thereto.

The first dummy network line DNL1 according to an embodiment of the present disclosure may be configured to be electrically connected to a pixel common voltage pad CVP in (or at) a pad part 110. For example, the first dummy network line DNL1 may be configured to be electrically connected to a pixel common voltage line CVL electrically connected to the pixel common voltage pad CVP. For example, the first dummy network line DNL1 may be disposed to intersect with the pixel common voltage line CVL and may be electrically connected to the pixel common voltage line CVL through a first contact hole CH1 provided in (or at) an intersection region between the first dummy network line DNL1 and the pixel common voltage line CVL.

The first dummy network line DNL1 according to another embodiment of the present disclosure may be configured to be electrically connected to a gate common power pad of a gate pad GP in (or at) the pad part 110. For example, the first dummy network line DNL1 may be configured to be electrically connected to a gate common power line GCPL electrically connected to the gate common power pad. For example, the first dummy network line DNL1 may be disposed to intersect with the gate common power line GCPL and may be electrically connected to the gate common power line GCPL through a first contact hole CH1 provided in (or at) an intersection region between the first dummy network line DNL1 and the gate common power line GCPL.

The second dummy network line DNL2 may be configured to be electrically connected to the first dummy network line DNL1 and a dummy pattern 160.

The second dummy network line DNL2 may be formed of the same material in the same process as the gate common power line GCPL. The second dummy network line DNL2 may be electrically connected to the first dummy network line DNL1 through a second contact hole CH2 provided in (or at) an intersection region between the second dummy network line DNL2 and the first dummy network line DNL1. The dummy pattern 160 may be electrically connected to the second dummy network line DNL2 through a third contact hole CH3 provided in (or at) an overlap region between the dummy pattern 160 and the second dummy network line DNL2. Accordingly, the dummy pattern 160 may be fixed to or maintained with a certain DC electric potential or an electric potential of the pixel common voltage supplied through the pixel common voltage line CVL (or the gate common power line GCPL), the first dummy network line DNL1, and the second dummy network line DNL2.

The second dummy network line DNL2 according to another embodiment of the present disclosure may extend from one side of the first dummy network line DNL1 to overlap the dummy pattern 160. The second dummy network line DNL2 may be formed of the same material in the same process as the first dummy network line DNL1. The dummy pattern 160 may be electrically connected to the second dummy network line DNL2 through a third contact hole CH3 provided in an overlap region between the dummy pattern 160 and the second dummy network line DNL2.

Therefore, a plurality of dummy patterns 160 may be fixed to or maintained with a certain DC electric potential or an electric potential of the pixel common voltage supplied through the pixel common voltage line CVL (or the gate common power line GCPL), the first dummy network line DNL1, and the second dummy network line DNL2. Accordingly, each of the plurality of dummy patterns 160 may reduce, minimize or prevent a size (or transmittance or transparency) deviation between transmissive parts TP caused by a size (or area) deviation between the branch circuits BC without causing a malfunction of the branch circuit BC or the TFT of the branch circuit BC, and thus, a light transmission rate or a transmittance of the display apparatus (or the transparent display apparatus) according to an embodiment of the present disclosure may be enhanced.

Figure 17:
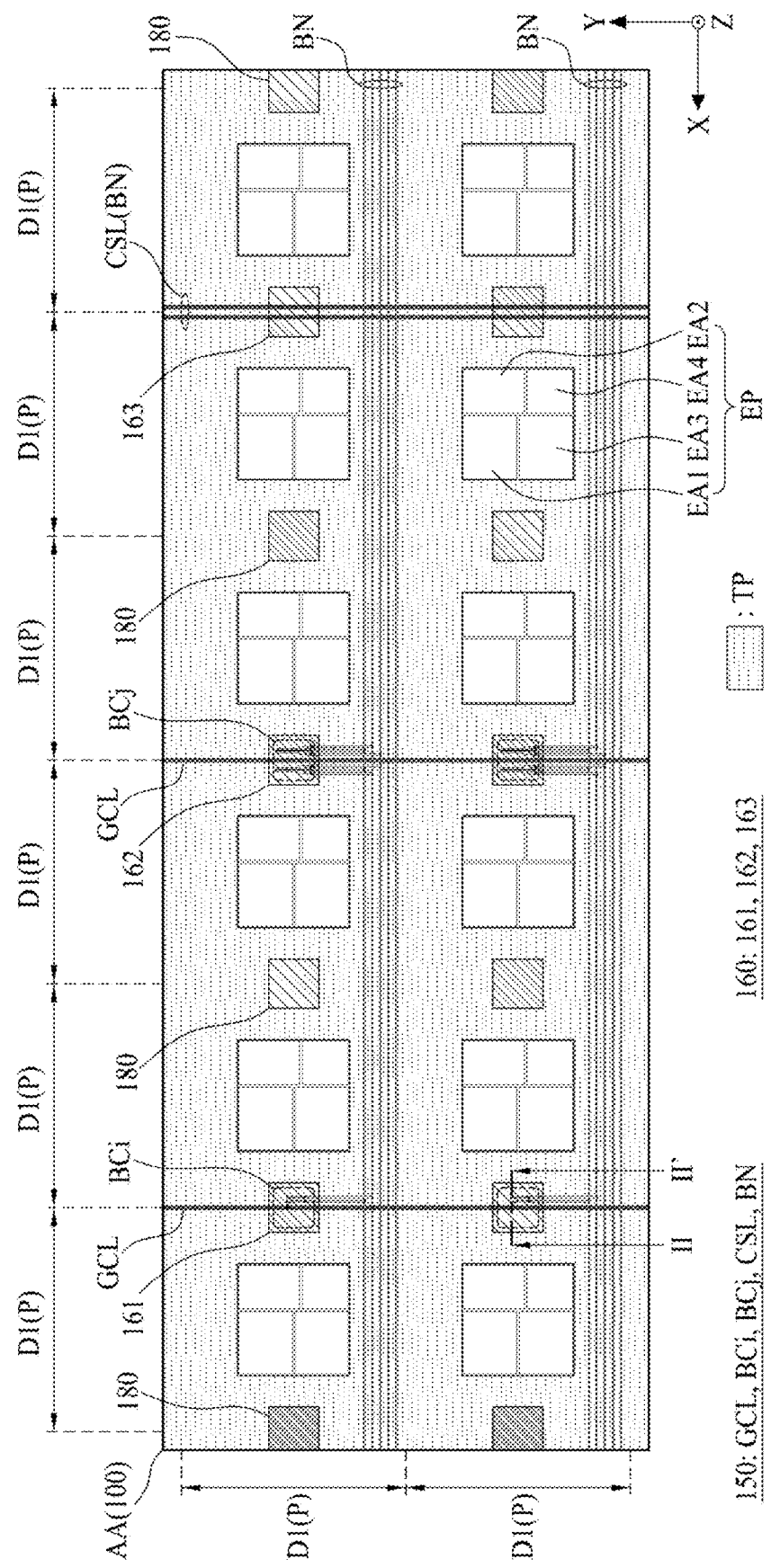
FIG. 17 is a diagram illustrating a display apparatus according to an embodiment of the present disclosure.

FIG. 17 is a diagram illustrating a display apparatus according to an embodiment of the present disclosure. FIG. 17 is a diagram illustrating a partial region of the display area illustrated in FIG. 10 and illustrates an embodiment where a plurality of second dummy patterns are additionally provided in the display apparatus according to an embodiment of the present disclosure illustrated in FIGS. 1 to 16. In the following description, therefore, repeated descriptions of the other elements except a plurality of second dummy patterns and relevant elements are omitted or may be briefly provided. A cross-sectional view taken along line II-IF illustrated in FIG. 17 is illustrated in FIG. 13 or 14.

Referring to FIG. 17, a display apparatus according to an embodiment of the present disclosure may further include a plurality of second dummy patterns 180. For example, the second dummy pattern 180 may be a second metal pattern, a second auxiliary pattern, a second additional pattern, a second cover pattern, a second pattern member, or a second island pattern. Accordingly, the dummy pattern 160 may be a first metal pattern, a first auxiliary pattern, a first additional pattern, a first cover pattern, a first pattern member, or a first island pattern.

Each of the plurality of second dummy patterns 180 may be disposed between the plurality of dummy patterns 160. Each of the plurality of second dummy patterns 180 may be disposed in (or at) a region between two pixels P between the plurality of dummy patterns 160. Each of the plurality of second dummy patterns 180 may be disposed in (or at) a transmissive part TP between a plurality of pixels P between the plurality of dummy patterns 160. For example, each of the plurality of second dummy patterns 180 may be disposed in (or at) a region (or a transmissive part TP), where the dummy pattern 160 is not disposed, of a region (or a transmissive part TP) between two pixels P adjacent to each other along the first direction X. For example, the display area AA may include a circuit disposition region including a branch circuit BC disposed between two adjacent pixels P and a circuit non-disposition region where a branch circuit BC is not disposed between two adjacent pixels P. Accordingly, each of the plurality of second dummy patterns 180 may be disposed in (or at) the circuit non-disposition region of a region between the plurality of pixels P.

According to an embodiment of the present disclosure, with respect to the first direction X, when first to $n^{th}$ pixels P are disposed in (or at) one horizontal line and the dummy pattern 160 is disposed between a $2k-1^{th}$ (where k is 1 to n−1) pixel and a $2k^{th}$ pixel, a second dummy pattern 180 may be disposed between the $2k^{th}$ pixel and a $2k+1^{th}$ pixel, but embodiments of the present disclosure are not limited thereto. For example, the dummy pattern 160 and the second dummy pattern 180 may be separately disposed (or distributedly disposed) between a plurality of pixels P in (or within) each horizontal line on the basis of the number of TFTs configuring one stage circuit unit and the number of pixels P disposed in one horizontal line.

According to an embodiment of the present disclosure, the dummy pattern 160 or the second dummy pattern 180 may be disposed between all pixels P disposed in (or at) the display area AA. For example, the dummy pattern 160 or the second dummy pattern 180 may be disposed in (or at) a region between two adjacent pixels P which are disposed in (or at) the display area AA along the first direction X. Therefore, sizes (or transmittance or transparency) of transmissive parts TP disposed or provided between all pixels P disposed in (or at) the display area AA along the first direction X may be substantially equal to one another, and thus, may reduce, minimize or prevent a dim phenomenon such as stripe smears or the like occurring due to a size (or transmittance or transparency) deviation between the transmissive parts TP, thereby enhancing a transmittance or transparency of the display apparatus (or the transparent display apparatus) according to an embodiment of the present disclosure.

Each of the plurality of second dummy patterns 180 may be configured to have the same shape and the same size. Each of the plurality of second dummy patterns 180 may be configured to be disposed at (or in) the same position between two pixels P adjacent to each other along the first direction X. For example, with respect to the first direction X, the plurality of second dummy patterns 180 may be positioned or aligned on (or at) the same line. For example, a center portion (or a middle portion) of each of the plurality of second dummy patterns 180 may be positioned or aligned on (or at) a virtual horizontal line parallel to the first direction X.

According to an embodiment of the present disclosure, each of the plurality of second dummy patterns 180 may have the same shape and the same size as each of the plurality of dummy patterns 160. Each of the plurality of second dummy patterns 180 and the plurality of dummy patterns 160 may be configured to be disposed at (or in) the same position between two pixels P adjacent to each other along the first direction X. For example, with respect to the first direction X, each of the plurality of second dummy patterns 180 and the plurality of dummy patterns 160 may be positioned or aligned on (or at) the same line. For example, a center portion (or a middle portion) of each of the plurality of second dummy patterns 180 and the plurality of dummy patterns 160 may be positioned or aligned on (or at) a virtual horizontal line parallel to the first direction X.

Each of the plurality of second dummy patterns 180 may be formed of the same material in the same process as the each of the plurality of dummy patterns 160, but embodiments of the present disclosure are not limited thereto.

The display apparatus according to an embodiment of the present disclosure may include a plurality of dummy patterns 160 and 180 disposed between all pixels P which are disposed in (or at) the display area AA along the first direction X, and the plurality of dummy patterns 160 and 180 may be classified into a plurality of first dummy patterns 160 overlapping the branch circuit BC and a plurality of second dummy patterns 180 which do not overlap the branch circuit BC and are disposed in (or at) the transmissive part TP. For example, each of the plurality of first dummy patterns 160 may be a circuit overlap pattern or a circuit cover pattern, and each of the plurality of second dummy patterns 180 may be a circuit non-overlap pattern.

As described above, because the display apparatus according to an embodiment of the present disclosure further includes the plurality of second dummy patterns 180 disposed in (or at) the transmissive parts TP between the plurality of dummy patterns 160, sizes (or transmittance or transparency) of transmissive parts TP disposed or provided between all pixels P which are disposed in (or at) the display area AA along the first direction X may be substantially equal to one another, and thus, may reduce, minimize or prevent a dim phenomenon such as stripe smears or the like occurring due to a size (or transmittance or transparency) deviation between the transmissive parts TP, thereby enhancing a transmittance or transparency of the display apparatus (or the transparent display apparatus) according to an embodiment of the present disclosure.

Figure 18:
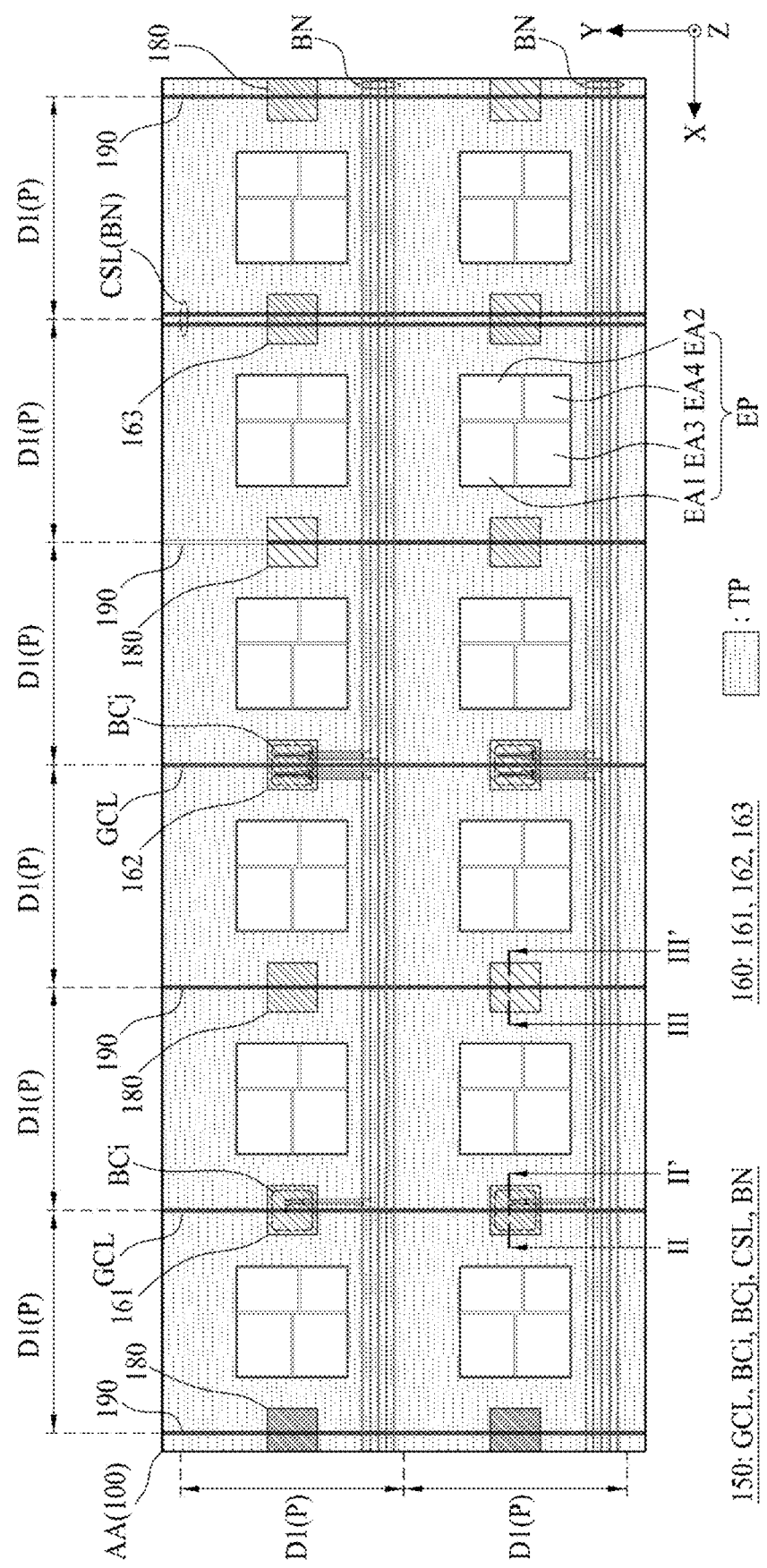
FIG. 18 is a diagram illustrating a display apparatus according to an embodiment of the present disclosure.
Figure 19:
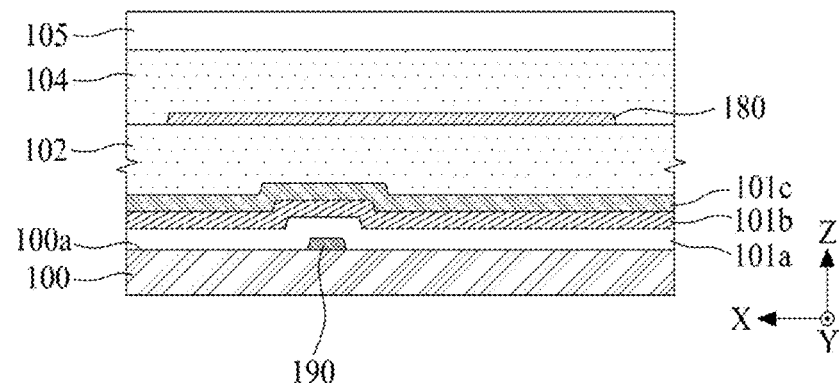
FIG. 19 is a cross-sectional view taken along line illustrated in FIG. 18.
Figure 20:
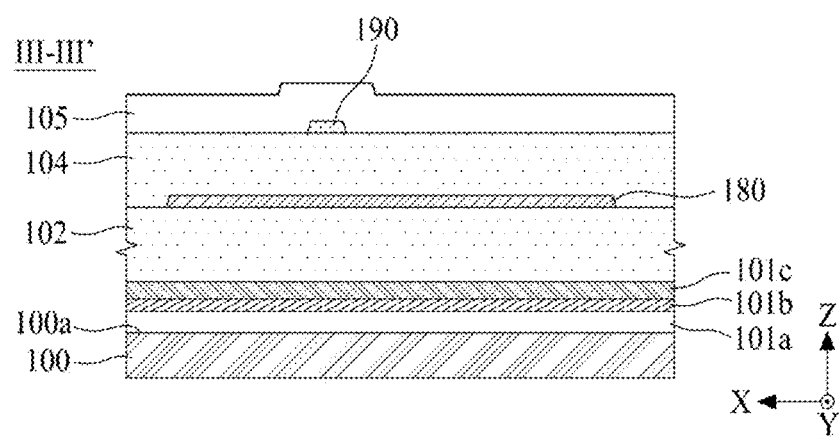
FIG. 20 is another cross-sectional view taken along line illustrated in FIG. 18.

FIG. 18 is a diagram illustrating a display apparatus according to an embodiment of the present disclosure. FIG. 19 is a cross-sectional view taken along line illustrated in FIG. 18. FIG. 20 is another cross-sectional view taken along line illustrated in FIG. 18. FIGS. 18 to 20 illustrate an embodiment where a second dummy line is additionally provided in the display apparatus according to an embodiment of the present disclosure illustrated in FIG. 17. In the following description, therefore, repeated descriptions of the other elements except a second dummy line and relevant elements are omitted or may be briefly provided. A cross-sectional view taken along line II-IF illustrated in FIG. 18 is illustrated in FIG. 13 or 14.

Referring to FIGS. 18 and 19, a display apparatus according to an embodiment of the present disclosure may further include a plurality of second dummy lines 190. For example, the second dummy lines 190 may be a second pattern connection line, a second pattern connection member, a second pattern bridge line, or a second pattern link line. Thus, the dummy lines 170 illustrated in FIG. 14 may be a first pattern connection line, a first pattern connection member, a first pattern bridge line, or a first pattern link line.

Each of the plurality of second dummy lines 190 may extend long in parallel with a second direction Y and may be configured or disposed on a substrate 100 to overlap a corresponding second dummy pattern of a plurality of second dummy patterns 180 disposed in (or at) a display area AA along the second direction Y. For example, each of the plurality of second dummy lines 190 may be disposed between the substrate 100 and each of the plurality of second dummy patterns 180, or may be disposed on each of the plurality of second dummy patterns 180.

According to an embodiment of the present disclosure, each of the plurality of second dummy lines 190 may be additionally configured for minimizing or compensating for a size (or transmittance or transparency) deviation of a transmissive part TP between adjacent pixels P caused by a carry signal line CSL or a gate control line GCL overlapping each of the plurality of dummy patterns 160. For example, the display area AA may include a line disposition region including a carry signal line CSL or a gate control line GCL disposed between two adjacent pixels P and a line non-disposition region where a carry signal line CSL or a gate control line GCL is not disposed between two adjacent pixels P. Therefore, a transmittance deviation between the line disposition region and the line non-disposition region may occur. Accordingly, each of the plurality of second dummy lines 190 may be configured so that a transmittance of the line disposition region is similar to or the same as that of the line non-disposition region. For example, each of the plurality of second dummy lines 190 may be disposed in (or at) the line non-disposition region so that a transmittance of the line non-disposition region decreases up to a level of a transmittance of the line disposition region.

Each of the plurality of second dummy lines 190 according to an embodiment of the present disclosure may be disposed on an upper surface 100a of the substrate 100 to overlap a corresponding second dummy pattern of the plurality of second dummy patterns 180 along the second direction Y and may be parallel to the second direction Y. For example, each of the plurality of second dummy lines 190 may be configured to directly contact the upper surface 100a of the substrate 100. Each of the plurality of second dummy lines 190 may be disposed on the same layer as the gate control line GCL. For example, each of the plurality of second dummy lines 190 may be formed of the same material in the same process as the gate control line GCL, but embodiments of the present disclosure are not limited thereto. For example, each of the plurality of second dummy lines 190 may be disposed in (or at) the line non-disposition region, and thus, may not be electrically connected to and may be electrically disconnected (or insulated) from each of the plurality of second dummy patterns 180, but embodiments of the present disclosure are not limited thereto. For example, each of the plurality of second dummy lines 190 may be maintained in an electrically floated state, but embodiments of the present disclosure are not limited thereto. For example, each of the plurality of second dummy lines 190 may be configured to be electrically connected to a corresponding second dummy pattern of the plurality of second dummy patterns 180 like the dummy line 170 illustrated in FIG. 14.

Each of the plurality of second dummy lines 190 according to an embodiment of the present disclosure, as illustrated in FIG. 20, may be disposed on a second overcoat layer 104 to overlap a corresponding second dummy pattern of the plurality of second dummy patterns 180 along the second direction Y. For example, each of the plurality of second dummy lines 190 may be disposed on the same layer as a pixel electrode. For example, each of the plurality of second dummy lines 190 may be formed of the same material in the same process as the pixel electrode, but embodiments of the present disclosure are not limited thereto. For example, each of the plurality of second dummy lines 190 may be disposed in (or at) the line non-disposition region, and thus, may not be electrically connected to and may be electrically disconnected (or insulated) from each of the plurality of second dummy patterns 180, but embodiments of the present disclosure are not limited thereto. For example, each of the plurality of second dummy lines 190 may be configured to be electrically connected to a corresponding second dummy pattern of the plurality of second dummy patterns 180 like the dummy line 170 illustrated in FIG. 14.

As described above, because the display apparatus according to an embodiment of the present disclosure further includes the plurality of second dummy patterns 180 disposed in (or at) the transmissive parts TP between the plurality of dummy patterns 160, and the plurality of second dummy lines 190 overlapping a corresponding second dummy pattern of the plurality of second dummy patterns 180, sizes (or transmittance or transparency) of transmissive parts TP disposed or provided between all pixels P which are disposed in (or at) the display area AA along the first direction X may be substantially equal to one another, and thus, may reduce, minimize or prevent a dim phenomenon such as stripe smears or the like occurring due to a size (or transmittance or transparency) deviation between the transmissive parts TP, thereby enhancing a transmittance or transparency of the display apparatus (or the transparent display apparatus) according to an embodiment of the present disclosure.

Figure 21:
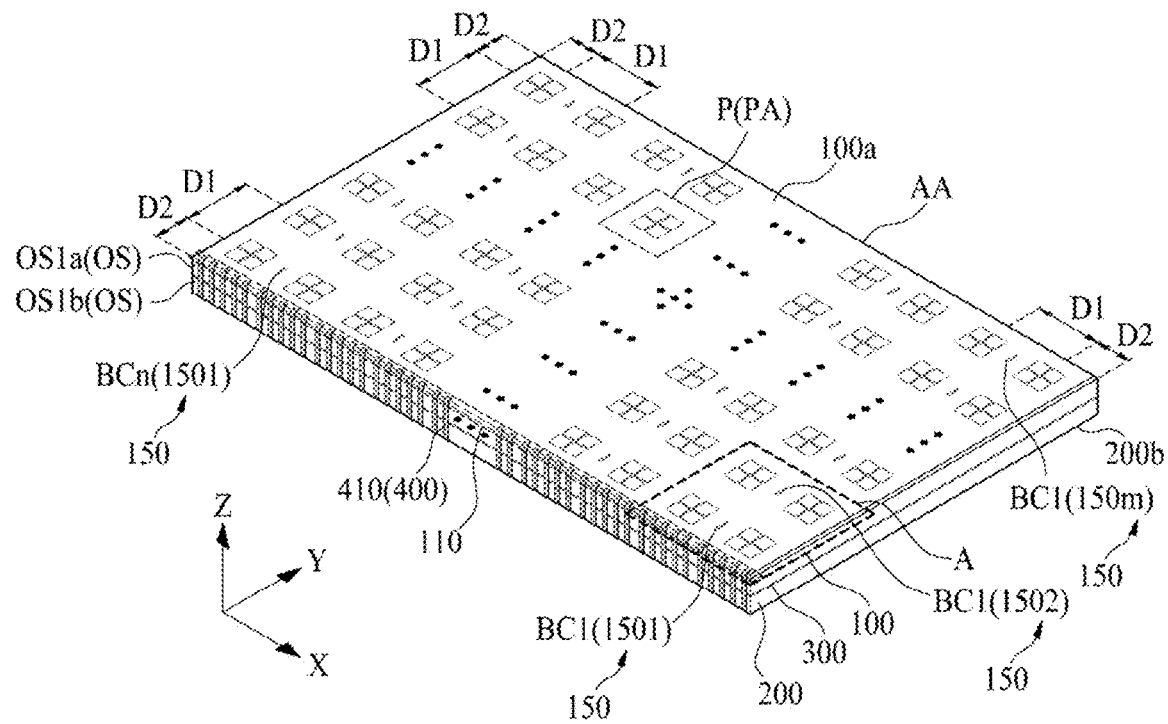
FIG. 21 is a perspective view illustrating a display apparatus according to another embodiment of the present disclosure.
Figure 22:
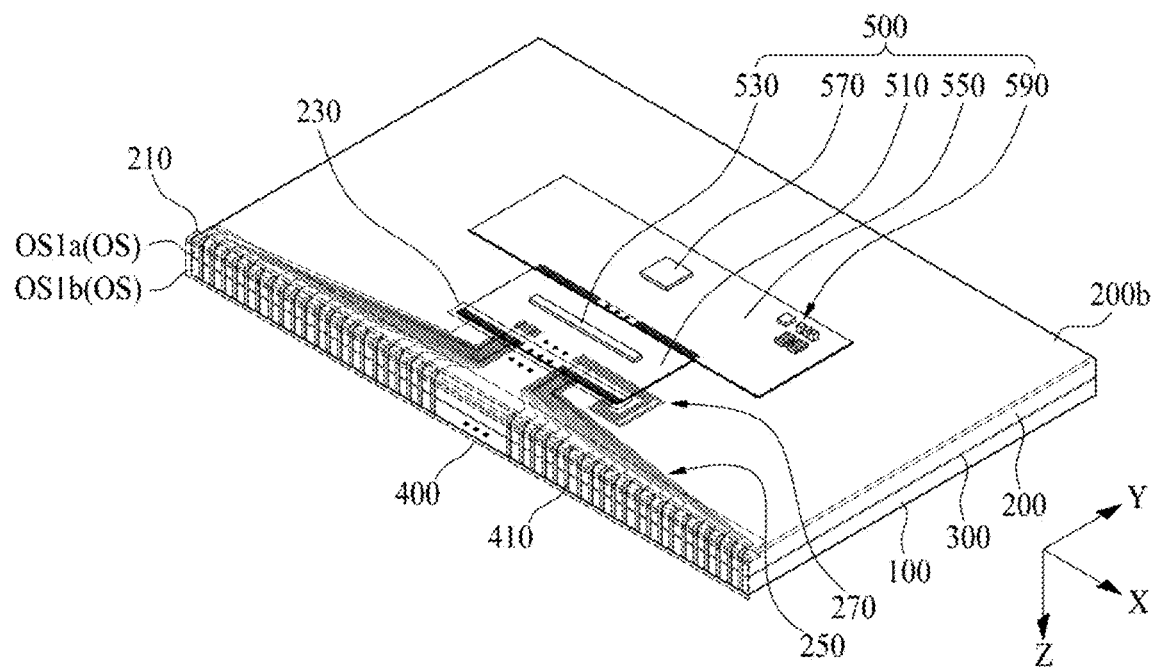
FIG. 22 is a diagram illustrating a rear surface of the display apparatus illustrated in FIG. 21.

FIG. 21 is a perspective view illustrating a display apparatus according to another embodiment of the present disclosure. FIG. 22 is a diagram illustrating a rear surface of the display apparatus illustrated in FIG. 21. A region 'A' illustrated in FIG. 21 may be a region 'B' illustrated in FIGS. 10 and 11.

Referring to FIGS. 21 and 22, a display apparatus according to another embodiment of the present disclosure may include a first substrate 100, a second substrate 200, a coupling member 300, and a routing portion 400.

The first substrate 100 may be referred to as a display substrate, a pixel array substrate, an upper substrate, a front substrate, or a base substrate. The first substrate 100 may include a display area AA, a plurality of gate lines GL, a plurality of data lines DL, a plurality of pixel driving power lines PL, a plurality of pixel common voltage lines CVL, a plurality of pixels P, a common electrode CE, a plurality of common electrode contact portions CECP, a pad part 110, a gate driving circuit 150, and a plurality of dummy patterns 160, or the like. The first substrate 100 may be substantially the same as the display panel 10 of the display apparatus illustrated in FIGS. 1 to 20, and thus, repeated descriptions thereof are omitted. For example, the substrate 100 of the display apparatus illustrated in FIGS. 1 to 20 may be replaced with the first substrate 100 illustrated in FIGS. 21 and 22, and thus, like reference numerals refer to like elements and repeated descriptions thereof are omitted or will be briefly given below. The pad part 110 disposed on the first substrate 100 may be a first pad part 110.

The second substrate 200 may be referred to as a line substrate, a wiring substrate, a link substrate, a lower substrate, a rear substrate, or a link glass. The second substrate 200 may be a glass substrate, a thin film glass substrate or a plastic substrate capable of being bent or curved. For example, the second substrate 200 may include or may be made of the same material as that of the first substrate 100. For example, a size of the second substrate 200 may be equal to or substantially equal to that of the first substrate 100.

The second substrate 200 may be coupled (or connected) to a second surface of the first substrate 100 by using a coupling member 300. The second substrate 200 may include a front surface (or a forward surface) which faces the second surface of the first substrate 100 or is coupled to the coupling member 300, a rear surface (or a backside surface) opposite to the front surface, and an outer surface OSb between the front surface and the rear surface. The second substrate 200 may transfer a signal to pixel driving signal lines and may increase stiffness of the first substrate 100.

The display apparatus according to another embodiment of the present disclosure may further include a second pad part 210 disposed on the second substrate 200.

The second pad part 210 may be disposed at a first edge portion (or a first periphery portion) of a rear surface of the second substrate 200 overlapping the first pad part 110 disposed on (or at) the first substrate 100. The first edge portion of the rear surface of the second substrate 200 may include a first outer surface (or one lateral surface) OS1b of an outer surface OS thereof.

The second pad part 210 may include a plurality of second pads which are disposed at a certain interval along a first direction X and respectively overlap pads of the first pad part 110.

The display apparatus according to another embodiment of the present disclosure may further include a third pad part (or an input pad part) 230, a link line portion 250, and a gate control signal transfer line portion 270, which are disposed on (or at) the second substrate 200.

The third pad part 230 may be disposed on (or at) a rear surface 200b of the second substrate 200. For example, the third pad part 230 may be disposed at a center portion, which is adjacent to a first edge portion (or a first periphery portion), of the rear surface 200b of the second substrate 200. The third pad part 230 according to an embodiment of the present disclosure may include a plurality of third pads (or input pads) which are spaced apart from one another by a certain interval.

The link line portion 250 may be disposed between the second pad part 210 and the third pad part 230. For example, the link line portion 250 may include a plurality of link lines which individually (or a one-to-one relationship) connect the second pads of the second pad part 210 with the third pads of the third pad part 230.

The gate control signal transfer line portion 270 may be disposed between the third pad part 230 and the link line portion 250. For example, the gate control signal transfer line portion 270 may include a gate control signal transfer line which individually connects a gate control signal pad, disposed in (or at) the third pad part 230, with a gate control signal link line disposed in (or at) the link line portion 250.

The coupling member 300 may be interposed between the first substrate 100 and the second substrate 200. The first substrate 100 and the second substrate 200 may be opposite-bonded to each other by the coupling member 300. For example, a second surface of the first substrate 100 may be coupled to one surface of the coupling member 300, and a front surface of the second substrate 200 may be coupled to the other surface of the coupling member 300. Accordingly, the first substrate 100 and the second substrate 200 bonded (or coupled) to each other by the coupling member 300 may be a display panel.

The routing portion 400 may be disposed to surround an outer surface OS of the first substrate 100 and the outer surface OS of the second substrate 200. The routing portion 400 according to an embodiment of the present disclosure may include a plurality of routing lines 410 which are disposed at each of a first outer surface (or one lateral surface) OS1a of the outer surface OS of the first substrate 100 and the first outer surface (or one lateral surface) OS1b of the outer surface OS of the second substrate 200.

Each of the plurality of routing lines 410 may be formed to surround each of the first outer surface OS1a of the first substrate 100 and the first outer surface OS1b of the second substrate 200. As an embodiment, the plurality of routing lines 410 may be individually (or a one-to-one relationship) connected between the pads of the first pad part 110, disposed on (or at) the first substrate 100, and the pads of the second pad part 210 disposed on (or at) the second substrate 200.

The display apparatus according to another embodiment of the present disclosure may further include a driving circuit unit 500.

The driving circuit unit 500 may drive (or emit light) pixels P disposed on (or at) the first substrate 100, based on digital image data and a synchronization signal supplied from a display driving system, and thus, may display an image corresponding to the image data on (or at) the display area AA. The driving circuit unit 500 may be connected to the third pad part 230 disposed on (or at) the rear surface 200b of the substrate 200 and may output, to the third pad part 230, a data signal, a gate control signal, and a driving power for driving (or emitting light) the pixels P disposed on (or at) the first substrate 100. For example, the driving circuit unit 500 may have a size which is smaller than that of the second substrate 200, and thus, may be covered by the second substrate 200 and may not be exposed at the outside of the outer surface of the first substrate 100 or the second substrate 200.

The driving circuit unit 500 according to an embodiment of the present disclosure may include a flexible circuit film 510, a driving integrated circuit (IC) 530, a printed circuit board (PCB) 550, a timing controller 570, and a power supply 590. The driving circuit unit 500 including such elements may be substantially the same as the driving circuit unit 30 illustrated in FIG. 1, and thus, repeated descriptions thereof are omitted or will be briefly given below.

The flexible circuit film 510 may be connected to the third pad part 230 disposed on (or at) the second surface 200b of the second substrate 200.

The driving IC 530 may be mounted on (or at) the flexible circuit film 510. The driving IC 530 may be connected to each of the plurality of data lines DL, the plurality of pixel driving power lines PL, the plurality of pixel common voltage lines CVL, a plurality of reference voltage lines RL via the flexible circuit film 510, the third pad part 230, the link line portion 250, the second pad part 210, the routing portion 400, and the first pad part 110. The driving IC 530 may receive subpixel data and a data control signal supplied from the timing controller 570, convert the subpixel data into an analog data signal on the basis of the data control signal, and supply the analog data signal to a corresponding data line DL. Also, the driving IC 530 may generate a reference voltage, a pixel driving power, and a pixel common voltage and may respectively supply the reference voltage, the pixel driving power, and the pixel common voltage to corresponding voltage lines RL, PL, and CVL.

The driving IC 530 may sense a characteristic value of a driving TFT disposed in (or at) a pixel P through the plurality of reference voltage lines RL disposed on (or at) the first substrate 100, generate sensing raw data corresponding to a sensing value, and supply the sensing raw data to the timing controller 570.

The PCB 550 may be connected to the other edge portion of the flexible circuit film 510. The PCB 550 may transfer a signal and power between the elements of the driving circuit unit 500.

The timing controller 570 may be mounted on (or at) the PCB 550 and may receive digital image data and a timing synchronization signal supplied from the display driving system through a user connector disposed on the PCB 550. The timing controller 570 may be substantially the same as the timing controller 37 of the panel driving circuit unit 30 illustrated in FIG. 1, and thus, repeated descriptions thereof are omitted.

As described above, the display apparatus according to another embodiment of the present disclosure may have the same effect as that of the display apparatus illustrated in FIGS. 1 to 20 and may have a zero-bezel structure or an air-bezel structure where the display area AA is surrounded by air instead of an opaque non-display area.

Figure 23:
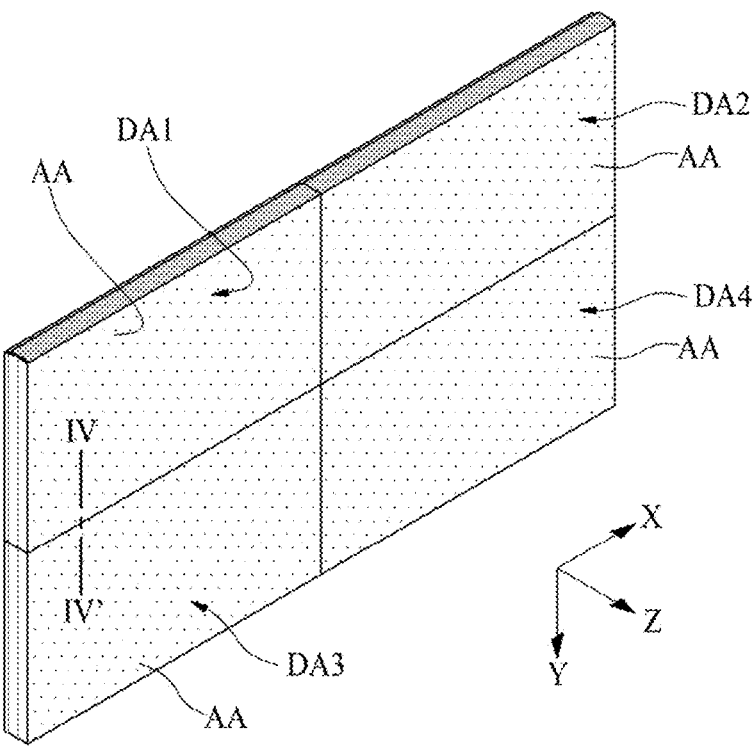
FIG. 23 is a diagram illustrating a multi-screen display apparatus according to an embodiment of the present disclosure.
Figure 24:
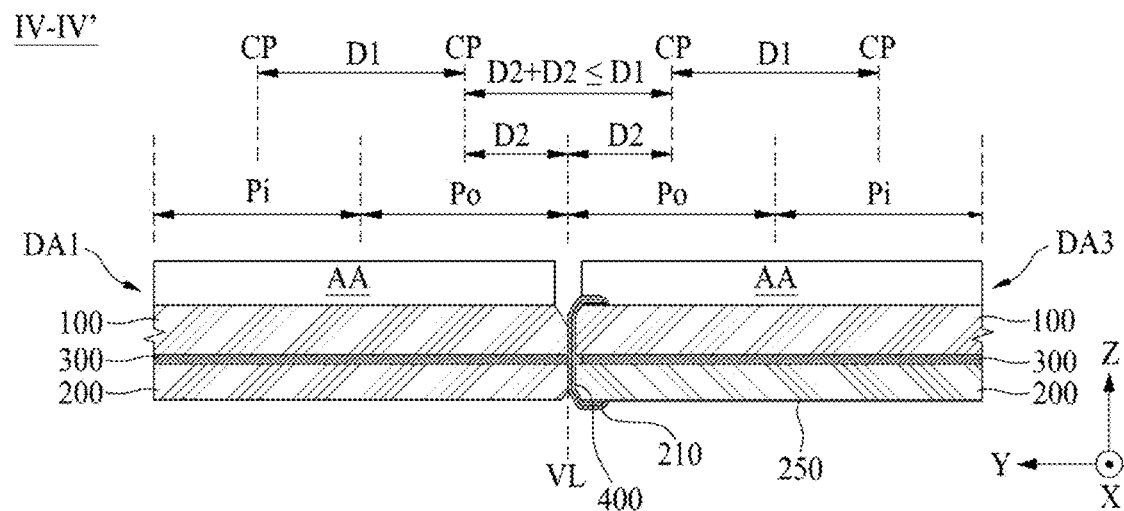
FIG. 24 is a cross-sectional view taken along line IV-IV' illustrated in FIG. 23.

FIG. 23 is a diagram illustrating a multi-screen display apparatus according to an embodiment of the present disclosure. FIG. 24 is a cross-sectional view taken along line IV-IV' illustrated in FIG. 23. FIGS. 23 and 24 illustrate a multi-screen display apparatus implemented by tiling the display apparatus according to another embodiment of the present disclosure illustrated in FIGS. 21 and 22.

Referring to FIGS. 23 and 24, the multi-screen display apparatus according to an embodiment of the present disclosure may include a plurality of display apparatuses DA1 to DA4.

The plurality of display apparatuses DA1 to DA4 may each display an individual image or may divisionally display one image. Each of the plurality of display apparatuses DA1 to DA4 may include the display apparatus according to another embodiment of the present disclosure illustrated in FIGS. 21 and 22, and thus, repeated descriptions thereof are omitted.

The plurality of display apparatuses DA1 to DA4 may be tiled on (or at) a separate tiling frame to contact each other at a side surface (or a lateral surface) thereof. For example, the plurality of display apparatuses DA1 to DA4 may be tiled to have an N×M form (where N is a positive integer of 2 or more and M is a positive integer of 2 or more), thereby implementing a multi-screen display apparatus having a large screen.

Each of the plurality of display apparatuses DA1 to DA4 may not include a bezel area (or a non-display area) surrounding all of a display area AA where an image is displayed, and may have an air-bezel structure where the display area AA is surrounded by air. That is, in each of the plurality of display apparatuses DA1 to DA4, all of a first surface of a first substrate 100 may be implemented as the display area AA.

According to an embodiment of the present disclosure, in each of the plurality of display apparatuses DA1 to DA4, a second interval D2 between a center portion CP of an outermost pixel Po and an outermost outer surface VL of the first substrate 100 may be implemented to be half or less of a first interval (or a pixel pitch) D1 between adjacent pixels Pi and Po. Accordingly, in two adjacent display apparatuses connected to (or contacting) each other at side surfaces thereof along the first direction X and the second direction Y on the basis of a lateral coupling manner, an interval "D2+D2" between adjacent outermost pixels Po may be equal to or less than the first interval D1 between two adjacent pixels Pi and Po.

Referring to FIG. 24, in first and third display apparatuses DA1 and DA3 connected to (or contacting) each other at side surfaces thereof along the second direction Y, the interval "D2+D2" between a center portion CP of an outermost pixel Po of the first display apparatus DA1 and a center portion CP of an outermost pixel Po of the third display apparatus DA3 may be equal to or less than the first interval D1 between two adjacent pixels Pi and Po disposed in (or at) each of the first and third display apparatuses DA1 and DA3.

Therefore, the interval "D2+D2" between center portions CP of outermost pixels Po of two adjacent display apparatuses connected to (or contacting) each other at side surfaces thereof along the first direction X and the second direction Y may be equal to or less than the first interval D1 between two adjacent pixels Pi and Po disposed in (or at) each of the display apparatuses DA1 to DA4, and thus, there may be no seam or boundary portion between two adjacent display apparatuses, whereby there may be no dark area caused by a boundary portion provided between the display apparatuses DA1 to DA4. As a result, the image displayed on the multi-screen display apparatus in which each of the plurality of display apparatuses DA1 to DA4 is tiled in a 2×2 form may be displayed continuously without a sense of disconnection (or discontinuity) at boundary portion between the plurality of display apparatuses DA1 to DA4.

In FIGS. 23 and 24, it is illustrated that the plurality of display apparatuses DA1 to DA4 are tiled in a 2×2 form, but embodiments of the present disclosure are not limited thereto, and the plurality of display apparatuses DA1 to DA4 may be tiled in an x×1 form, a 1×y form, or an x×y form. Here, the x may be two or more natural numbers or equal to the y. The y may be two or more natural numbers or greater or less than the x.

As described above, when display area AA of each of the plurality of display apparatuses DA1 to DA4 is one screen and displays one image, a multi-screen display apparatus according to an embodiment of the present disclosure may display an image which is not disconnected and is continuous at a boundary portion between the plurality of display apparatuses DA1 to DA4, and thus, the immersion of a viewer watching an image displayed by the multi-screen display apparatus may be enhanced.

Alternatively, in the multi-screen display apparatus according to the present disclosure, each of the plurality of display apparatuses DA1 to DA4 may include the display apparatus according to an embodiment of the present disclosure illustrated in FIGS. 1 to 20. In this case, in the display apparatus according to an embodiment of the present disclosure illustrated in FIG. 1, the flexible circuit film 31 may be bent to surround a side surface of the substrate 100, and the PCB 35 may be disposed on (or at) the rear surface of the substrate 100. A substrate 100 of the display apparatus according to illustrated in FIG. 1 may be substantially the same as a first substrate 100 illustrated in FIG. 21, and thus, the display apparatuses illustrated in FIG. 1 may be tiled in an x×1 form, a 1×y form, or an x×y form to implement a multi-screen display apparatus (or a transparent multi-screen display apparatus). Accordingly, the multi-screen display apparatus tiling the display apparatuses illustrated in FIG. 1 may display an image which is continuous at a boundary portion between the plurality of display apparatuses DA1 to DA4 without a sense of disconnection (or discontinuity) of the image.

A display apparatus and a multi-screen display apparatus including the same according to the present disclosure will be described below.

A display apparatus according to an embodiment of the present disclosure may comprise a substrate including a display area including a plurality of pixels disposed along a first direction and a second direction intersecting with the first direction, and a gate driving circuit including a plurality of stage circuit units respectively provided at a plurality of horizontal lines of the display area to supply a scan signal to the plurality of pixels, each of the plurality of stage circuit units may comprise a plurality of branch circuits supplying the scan signal to the plurality of pixels, and a plurality of circuit connection lines connected to the plurality of branch circuits and formed of a transparent conductive material.

According to some embodiments of the present disclosure, the plurality of circuit connection lines may be disposed at a lower region or an upper region of each of the plurality of horizontal lines.

According to some embodiments of the present disclosure, the display area may comprise a plurality of pixel groups each including two or more adjacent pixels, and each of the plurality of branch circuits may be disposed between the plurality of pixel groups.

According to some embodiments of the present disclosure, each of the plurality of circuit connection lines may comprise metal oxide.

According to some embodiments of the present disclosure, each of the plurality of pixels and the plurality of branch circuits may comprise one or more thin film transistors, and each of the plurality of circuit connection lines may comprise the same material as a material of an active layer of each of the one or more thin film transistors.

According to some embodiments of the present disclosure, some of the plurality of circuit connection lines provided at each of the plurality of horizontal lines may be shared by the plurality of branch circuits provided at each of two horizontal lines adjacent thereto along the second direction.

According to some embodiments of the present disclosure, the display apparatus may further comprise a plurality of dummy patterns respectively covering the plurality of branch circuits.

According to some embodiments of the present disclosure, the display apparatus may further comprise a first overcoat layer on the plurality of branch circuits, and a second overcoat layer on the first overcoat layer, each of the plurality of dummy patterns may be disposed between the first overcoat layer and the second overcoat layer.

According to some embodiments of the present disclosure, each of the plurality of dummy patterns may have a size which is greater than a size of a corresponding branch circuit.

According to some embodiments of the present disclosure, each of the plurality of branch circuits may comprise one or more thin film transistors, and one or more of the plurality of branch circuits may have different sizes.

According to some embodiments of the present disclosure, the plurality of dummy patterns may have the same size, or may have the same size and the same shape.

According to some embodiments of the present disclosure, the display apparatus may further comprise a plurality of dummy lines overlapping the plurality of dummy patterns disposed along the second direction.

According to some embodiments of the present disclosure, the display apparatus may further comprise a plurality of gate control lines overlapping the plurality of dummy patterns disposed along the second direction, the plurality of gate control lines respectively overlap the plurality of dummy lines and may be respectively connected to the plurality of stage circuit units.

According to some embodiments of the present disclosure, a width of an overlap region between the dummy line and the gate control line may be equal to a line width of the gate control line.

According to some embodiments of the present disclosure, the display apparatus may further comprise a first overcoat layer on the plurality of branch circuits, and a second overcoat layer on the first overcoat layer, each of the plurality of dummy patterns may be disposed between the first overcoat layer and the second overcoat layer, and each of the plurality of dummy lines may be disposed on the second overcoat layer and may be electrically connected to the plurality of dummy patterns.

According to some embodiments of the present disclosure, each of the plurality of dummy lines may be configured to supply a direct current (DC) voltage to each of the plurality of dummy patterns.

According to some embodiments of the present disclosure, the display apparatus may further comprise a plurality of second dummy patterns disposed between the plurality of dummy patterns along the first direction.

According to some embodiments of the present disclosure, each of the plurality of second dummy patterns may be disposed between two pixels between the plurality of dummy patterns.

According to some embodiments of the present disclosure, the display apparatus may further comprise a second dummy line overlapping the plurality of second dummy patterns along the second direction.

According to some embodiments of the present disclosure, the display apparatus may further comprise a rear substrate coupled to a rear surface of the substrate by using a coupling member, and a routing portion disposed at an outer surface of the substrate and an outer surface of the rear substrate, the routing portion including a plurality of routing lines connected to the plurality of pixels.

According to some embodiments of the present disclosure, each of the plurality of dummy patterns may be configured to include a material for collecting hydrogen.

According to some embodiments of the present disclosure, each of the plurality of pixels may comprise an emission part including a light emitting device, and a transmissive part at a periphery of the emission part, and each of the plurality of branch circuits may be disposed at the transmissive part.

A multi-screen display apparatus according to some embodiments of the present disclosure may comprise a plurality of display apparatuses disposed along at least one direction of a first direction and a second direction intersecting with the first direction, each of the plurality of display apparatuses may comprise a substrate including a display area including a plurality of pixels disposed along a first direction and a second direction intersecting with the first direction, and a gate driving circuit including a plurality of stage circuit units respectively disposed at a plurality of horizontal lines of the display area to supply a scan signal to the plurality of pixels, each of the plurality of stage circuit units comprises a plurality of branch circuits supplying the scan signal to the plurality of pixels, and a plurality of circuit connection lines connected to the plurality of branch circuits and formed of a transparent conductive material.

According to some embodiments of the present disclosure, each of the plurality of pixels disposed at a display area of each of the plurality of display apparatuses may comprise an emission part including a light emitting device, and a transmissive part at a periphery of the emission part, and each of the plurality of branch circuits may be disposed at the transmissive part.

According to some embodiments of the present disclosure, in a first display apparatus and a second display apparatus adjacent to each other along the first direction and the second direction, a distance between a center portion of an outermost pixel of the first display apparatus and a center portion of an outermost pixel of the second display apparatus may be less than or equal to a pixel pitch, and the pixel pitch may be a distance between center portions of two adjacent pixels disposed at each of the plurality of display apparatuses.

A display apparatus according to an embodiment of the present disclosure may comprise: a display panel, including: a substrate including a display area including a plurality of pixels disposed along a first direction and a second direction intersecting with the first direction; and a gate driving circuit including a plurality of stage circuit units respectively disposed at a plurality of horizontal lines of the display area to supply a scan signal to the plurality of pixels in response to a gate control signal, wherein each of the plurality of stage circuit units comprises: a plurality of branch circuits supplying the scan signal to the plurality of pixels; and a plurality of circuit connection lines connected to the plurality of branch circuits, the plurality of circuit connection lines including a transparent conductive material; and a driving circuit unit supplying the gate control signal to the gate driving circuit.

According to some embodiments of the present disclosure, the display panel may further include a pad part disposed at an edge of the display area, via which the driving circuit unit is connected to each of the plurality of pixels and the gate driving circuit.

According to some embodiments of the present disclosure, the display apparatus may further comprise a plurality of dummy patterns respectively covering the plurality of branch circuits.

According to some embodiments of the present disclosure, the display apparatus may further comprise a plurality of dummy lines overlapping the plurality of dummy patterns disposed along the second direction.

The display apparatus (or transparent display apparatus) according to an embodiment of the present disclosure may be applied to all electronic devices including a display panel. For example, the display apparatus (or transparent display apparatus) according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic books, portable multimedia players (PMPs), personal digital assistants (PDAs), MP3 players, mobile medical apparatuses, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, or the like.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the display apparatus and the multi-screen display apparatus including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus, comprising:
a substrate including a display area including a plurality of pixels disposed along a first direction and a second direction intersecting with the first direction; and
a gate driving circuit including a plurality of stage circuit units respectively disposed at a plurality of horizontal lines of the display area to supply a scan signal to the plurality of pixels,
wherein each of the plurality of pixels comprises:
an emission part including a light emitting device; and
a transmissive part at a periphery of the emission part,
wherein each of the plurality of stage circuit units comprises:
a plurality of branch circuits configured to supply the scan signal respectively to the plurality of pixels, each of the plurality of branch circuits being disposed at the transmissive part; and
a plurality of circuit connection lines connected to the plurality of branch circuits, the plurality of circuit connection lines including a transparent conductive material.

2. The display apparatus of claim 1, wherein the plurality of circuit connection lines are disposed at a lower region or an upper region of each of the plurality of horizontal lines.

3. The display apparatus of claim 2, wherein:
the display area comprises a plurality of pixel groups each including two or more adjacent pixels, and
each of the plurality of branch circuits is disposed between the emission parts respectively in two adjacent pixel groups among the plurality of pixel groups.

4. The display apparatus of claim 1, wherein each of the plurality of circuit connection lines comprises metal oxide.

5. The display apparatus of claim 1, wherein:
each of the plurality of pixels and the plurality of branch circuits comprises one or more thin film transistors, and
each of the plurality of circuit connection lines comprises the same material as a material of an active layer of each of the one or more thin film transistors.

6. The display apparatus of claim 1, wherein some of the plurality of circuit connection lines provided at each of the plurality of horizontal lines are shared by the plurality of branch circuits provided at each of two horizontal lines adjacent thereto along the second direction.

7. A multi-screen display apparatus, comprising:
a plurality of display apparatuses disposed along at least one direction of a first direction and a second direction intersecting with the first direction,
wherein each of the plurality of display apparatuses comprises the display apparatus of claim 1.

8. The multi-screen display apparatus of claim 7, wherein in a first display apparatus and a second display apparatus adjacent to each other along the first direction and the second direction, a distance between a center portion of an outermost pixel of the first display apparatus and a center portion of an outermost pixel of the second display apparatus is less than or equal to a pixel pitch, and
wherein the pixel pitch is a distance between center portions of two adjacent pixels disposed at each of the plurality of display apparatuses.

9. A display apparatus, comprising:
a substrate including a display area including a plurality of pixels disposed along a first direction and a second direction intersecting with the first direction; and
a gate driving circuit including a plurality of stage circuit units respectively disposed at a plurality of horizontal lines of the display area to supply a scan signal to the plurality of pixels, each of the plurality of stage circuit units comprising:
a plurality of branch circuits configured to supply the scan signal respectively to the plurality of pixels; and
a plurality of circuit connection lines connected to the plurality of branch circuits, the plurality of circuit connection lines including a transparent conductive material; and
a plurality of dummy patterns respectively covering the plurality of branch circuits.

10. The display apparatus of claim 9, further comprising:
a first overcoat layer on the plurality of branch circuits; and
a second overcoat layer on the first overcoat layer,
wherein each of the plurality of dummy patterns is disposed between the first overcoat layer and the second overcoat layer.

11. The display apparatus of claim 9, wherein each of the plurality of dummy patterns has a size which is greater than a size of a corresponding branch circuit.

12. The display apparatus of claim 9, wherein:
each of the plurality of branch circuits comprises one or more thin film transistors, and
wherein one or more of the plurality of branch circuits have different sizes.

13. The display apparatus of claim 12, wherein the plurality of dummy patterns have the same size, or have the same size and the same shape.

14. The display apparatus of claim 12, further comprising a plurality of dummy lines overlapping the plurality of dummy patterns disposed along the second direction.

15. The display apparatus of claim 14, further comprising a plurality of gate control lines overlapping the plurality of dummy patterns disposed along the second direction,
wherein the plurality of gate control lines respectively overlap the plurality of dummy lines and are respectively connected to the plurality of stage circuit units.

16. The display apparatus of claim 15, further comprising:
a first overcoat layer on the plurality of branch circuits; and
a second overcoat layer on the first overcoat layer,
wherein each of the plurality of dummy patterns is disposed between the first overcoat layer and the second overcoat layer, and wherein each of the plurality of dummy lines is disposed on the second overcoat layer and is electrically connected to the plurality of dummy patterns.

17. The display apparatus of claim 16, wherein each of the plurality of dummy lines is configured to supply a direct current voltage to each of the plurality of dummy patterns.

18. The display apparatus of claim 12, further comprising a plurality of second dummy patterns disposed between the plurality of dummy patterns along the first direction.

19. The display apparatus of claim 18, wherein each of the plurality of second dummy patterns is disposed between two pixels between the plurality of dummy patterns.

20. The display apparatus of claim 18, further comprising a second dummy line overlapping the plurality of second dummy patterns along the second direction.

21. The display apparatus of claim 9, wherein each of the plurality of dummy patterns is configured to include a material for collecting hydrogen.

22. A multi-screen display apparatus, comprising:
a plurality of display apparatuses disposed along at least one direction of a first direction and a second direction intersecting with the first direction,
wherein each of the plurality of display apparatuses comprises the display apparatus of claim 9.

23. The multi-screen display apparatus of claim 22, wherein each of the plurality of pixels disposed at a display area of each of the plurality of display apparatuses comprises:
an emission part including a light emitting device; and
a transmissive part at a periphery of the emission part, and
wherein each of the plurality of branch circuits is disposed at the transmissive part.

24. A display apparatus, comprising:
a display panel, including:
a substrate including a display area including a plurality of pixels disposed along a first direction and a second direction intersecting with the first direction, each of the plurality of pixels comprising:
an emission part including a light emitting device; and
a transmissive part at a periphery of the emission part; and
a gate driving circuit including a plurality of stage circuit units respectively disposed at a plurality of horizontal lines of the display area to supply a scan signal to the plurality of pixels in response to a gate control signal, wherein each of the plurality of stage circuit units comprises:
a plurality of branch circuits configured to supply the scan signal respectively to the plurality of pixels, each of the plurality of branch circuits being disposed at the transmissive part; and
a plurality of circuit connection lines connected to the plurality of branch circuits, the plurality of circuit connection lines including a transparent conductive material; and
a driving circuit unit configured to supply the gate control signal to the gate driving circuit.

25. The display apparatus of claim 24, wherein the display panel further includes a pad part disposed at an edge of the display area, via which the driving circuit unit is connected to each of the plurality of pixels and the gate driving circuit.

26. The display apparatus of claim 24, further comprising a plurality of dummy patterns respectively covering the plurality of branch circuits.

27. The display apparatus of claim 26, further comprising a plurality of dummy lines overlapping the plurality of dummy patterns disposed along the second direction.

* * * * *